United States Patent
Kondo et al.

(10) Patent No.: US 6,807,056 B2
(45) Date of Patent: Oct. 19, 2004

(54) ELECTRONIC EQUIPMENT

(75) Inventors: Yoshihiro Kondo, Tsuchiura (JP); Shigeo Ohashi, Tsuchiura (JP); Rintaro Minamitani, Tsukuba (JP); Takashi Naganawa, Chiyoda (JP); Yuji Yoshitomi, Chiyoda (JP); Masato Nakanishi, Tokyo (JP); Yasuhiko Sasaki, Chiyoda (JP); Tsuyoshi Nakagawa, Hadano (JP); Osamu Suzuki, Chiyoda (JP); Shinji Matsushita, Chigasaki (JP); Yasunori Yamada, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/621,647

(22) Filed: Jul. 18, 2003

(65) Prior Publication Data
US 2004/0057211 A1 Mar. 25, 2004

(30) Foreign Application Priority Data

Sep. 24, 2002 (JP) .................................... 2002-276561
Feb. 13, 2003 (JP) .................................... 2003-035502

(51) Int. Cl.[7] .............................................. H05K 7/20
(52) U.S. Cl. .................... 361/689; 361/690; 361/694; 361/695; 361/696; 361/699; 174/16.1; 165/80.4; 165/104.33; 454/184
(58) Field of Search ................... 361/687–690, 361/694–699; 174/16.1; 165/80.4, 104.33; 62/259.2; 454/184

(56) References Cited

U.S. PATENT DOCUMENTS

| 5,323,847 | A | * | 6/1994 | Koizumi et al. | ....... 165/104.33 |
| 5,365,749 | A | * | 11/1994 | Porter | ........................ 62/259.2 |
| 5,509,468 | A | * | 4/1996 | Lopez | .......................... 165/144 |
| 6,234,240 | B1 | * | 5/2001 | Cheon | ......................... 165/80.3 |
| 6,313,990 | B1 | * | 11/2001 | Cheon | .......................... 361/699 |
| 6,747,869 | B2 | * | 6/2004 | Dong | ........................... 361/687 |
| 2004/0008483 | A1 | * | 1/2004 | Cheon | .......................... 361/687 |

FOREIGN PATENT DOCUMENTS

| JP | 6-97338 | 4/1994 | ......... H01L/23/473 |
| JP | 6-266474 | 9/1994 | ............. G06F/1/20 |
| JP | 7-142886 | 6/1995 | ............ H05K/7/20 |

* cited by examiner

Primary Examiner—Boris Chervinsky
(74) Attorney, Agent, or Firm—Antonelli, Terry, Stout & Kraus, LLP

(57) ABSTRACT

A plurality of electronic apparatuses, each apparatus having a closed loop cooling system, are installed in a cabinet having another closed loop fluid cooling system. Each of the closed loop fluid cooling systems includes a heat receiver and a pump. A projection is mounted on the electronic apparatus and a switching valve is arranged on the cabinet to stop or start circulation of a cooling fluid.

30 Claims, 17 Drawing Sheets

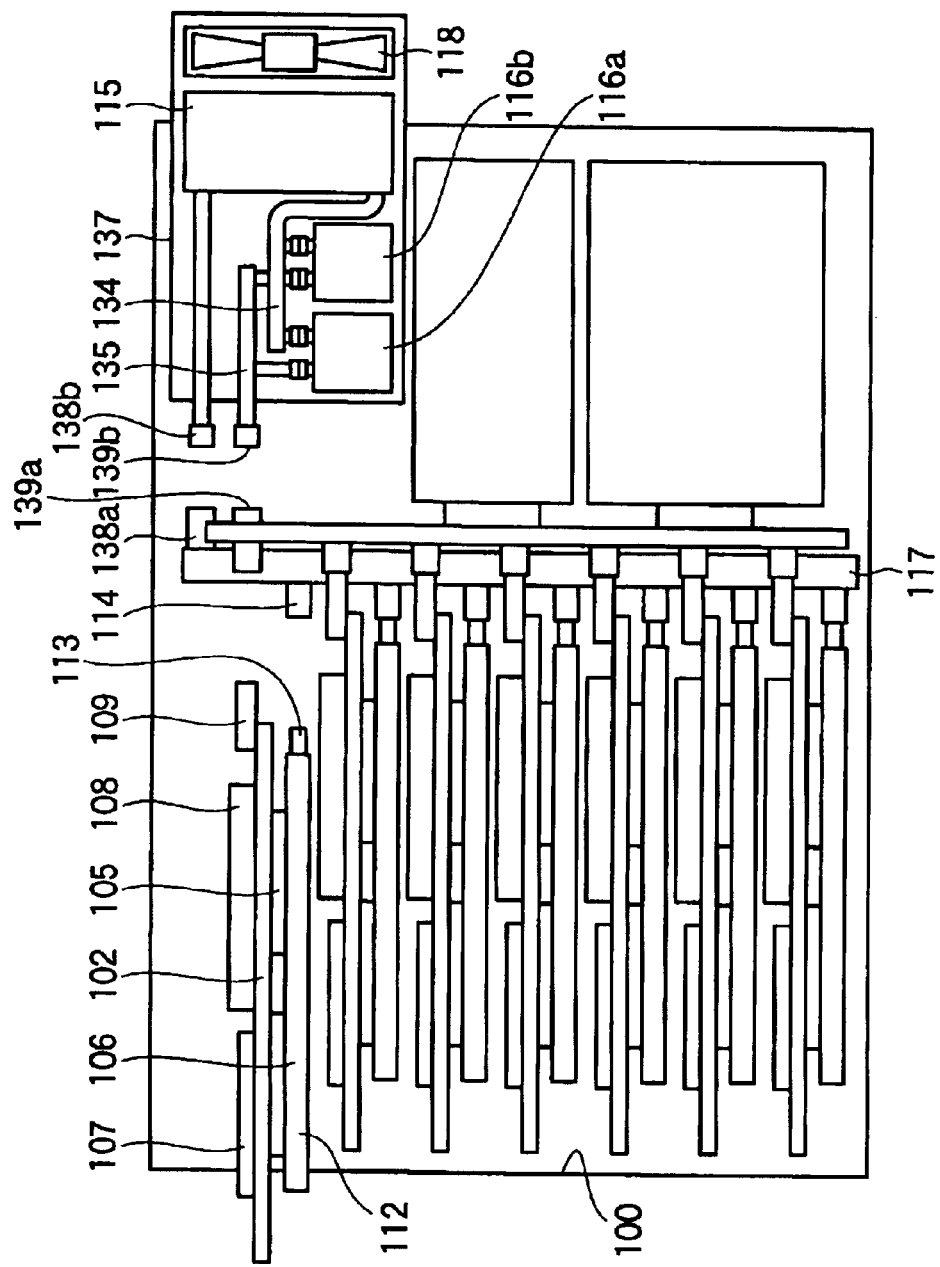

ELECTRONIC EQUIPMENT

BACKGROUND OF THE INVENTION

1. Field of the Invention

The present invention relates to electronic equipment having a cooling device circulating a cooling fluid.

2. Description of the Related Art

Electronic equipment includes mainframe computers and medium-scale server computers used by corporates such as banks, in addition to widely used personal computers and desk-top computers.

Server computers as electronic equipment are typically connected to a plurality of terminals. Such electronic equipment is formed of a plurality of stacked electronic devices, which run software programs for calculation or retrieving mail data.

Depending on the purposes of applications, the user must replace, add, or remove the electronic devices, each running the software program of its own.

The electronic equipment must be continuously powered 24 hours a day because the electronic equipment is constantly accessed by any of the terminals.

Each electronic device typically includes a sub-cooling unit in addition to a main-cooling unit. In the case of a failure of the main-cooling unit, an alarm alerting the user to the failure is triggered. The sub-cooling unit cools the electronic device until the main-cooling unit is restored.

Such cooling devices of the electronic equipment typically employ fans.

In step with the latest high processing speed and large memory capacity, semiconductor devices such as central processing units (CPUs) rise high in temperature to the degree with which a cooling device using a fan has difficulty. If cooling efficiency is increased, a noise problem due to high speed rotation of the fan arises. The cooling device using a cooling fluid circulation, once used in the mainframe computer field, is now reviewed.

Under these situations, a cooling device of the conventional art using a cooling fluid circulation is now studied from safety and reliability considerations.

For example, Japanese Unexamined Patent Application Publication No. 6-97338 discloses a fluid circulating type cooling device of a mainframe computer. In the disclosure, many wiring boards, each having a semiconductor device generating heat, are stacked in a casing of electronic equipment. A flat header is attached to the semiconductor. A cooling fluid is circulated in a flexible tube routed between the heat generator and a heat exchanger, thereby cooling the heat generator.

Japanese Unexamined Patent Application Publication No. 5-142886 discloses a notebook computer having a cooling device using a cooling fluid circulation. In the disclosure, a highly reliable and high-performance cooling device is used for a mobile electronic apparatus such as a notebook computer. A flexible heat transport device having a heat receiving header, a heat dissipating header, and a flexible tube is used in the cooling device.

In accordance with the conventional art described in the above disclosures, a cooling fluid, running through a flexible tube routed on a wiring board having heat generating electronic components, circulates between heat generating elements and a heat exchanger. No sufficient consideration is given to the loading and unloading of the wiring board.

When a wiring board having heat generating electronic components is loaded in a casing of electronic equipment, thermal coupling to a heat sink path (a cooling fluid piping) of the heat generating electronic components must be easily established in addition to electrical connection. There is no mention of such a structure satisfying this requirement in the above disclosures. The server in a network system has difficulty in the removal of a wiring board in need of replacement and the loading of another wiring board with safety in the casing particularly in the middle of operation of the electronic apparatus. In such electronic equipment, a new electronic module as a wiring board having heat generating electronic components must be occasionally added.

If a wiring board mounted in the electronic apparatus or a component in a cooling fluid circulation system fails, the wiring board or the component must be replaced. However, the above conventional arts provide no mechanism appropriate for allowing a corrective action to take without stopping the operation of the system.

If the fluid circulation type cooling device is attached to each electronic apparatus, the cooling device may be duplicated, such as a safety mechanism using a fan.

The duplication of the fluid circulation type cooling device in each electronic apparatus raises space and cost problems.

SUMMARY OF THE INVENTION

Accordingly, it is an object of the present invention to provide reliable electronic equipment that is free from the above mentioned problem.

It is another object of the present to provide electronic equipment which has a cooling structure that allows electronic modules to be added or maintained, a structure of a casing of the electronic equipment, and such an electronic module appropriate for the structure of the casing.

The present invention relates to electronic equipment, and includes a plurality of electronic apparatuses, each electronic apparatus having a semiconductor element, a rack for storing the plurality of electronic apparatuses stacked with one above another, a first cooling device, in the electronic apparatus, including a first heat receiver for receiving heat from the semiconductor element, a first fluid circulator for circulating a fluid through the first heat receiver, a first heat exchanger for discharging heat of the fluid, and a first piping for connecting the first heat receiver, the first fluid circulator, and the first heat exchanger, and a second cooling device, in the rack, including a second heat receiver in contact with the first heat receiver, a second fluid circulator for circulating the fluid through the second heat receiver, a second heat exchanger in contact with the second heat receiver, and a second piping for connecting the second heat receiver, the second fluid circulator, and the second heat exchanger.

Preferably, the first cooling device is detachably mounted on the rack, and the second piping includes a switching valve for switching the supplying of the fluid to the second cooling device when the first cooling device is mounted to or demounted from the rack.

Preferably, the direction of circulation of the fluid circulating in the first cooling device is different from the direction of circulation of the fluid circulating in the second cooling device.

Preferably, the diameter of the second piping becomes smaller from upstream to downstream in the circulation of the fluid.

BRIEF DESCRIPTION OF THE DRAWINGS

FIG. 14 is a top view of a modification of the electronic apparatus;

DESCRIPTION OF THE PREFERRED EMBODIMENTS

The present invention achieves an efficient cooling device which requires no duplication of the fluid circulation cooling device in each electronic apparatus. Embodiments of the present invention will now be discussed.

Figure 1:
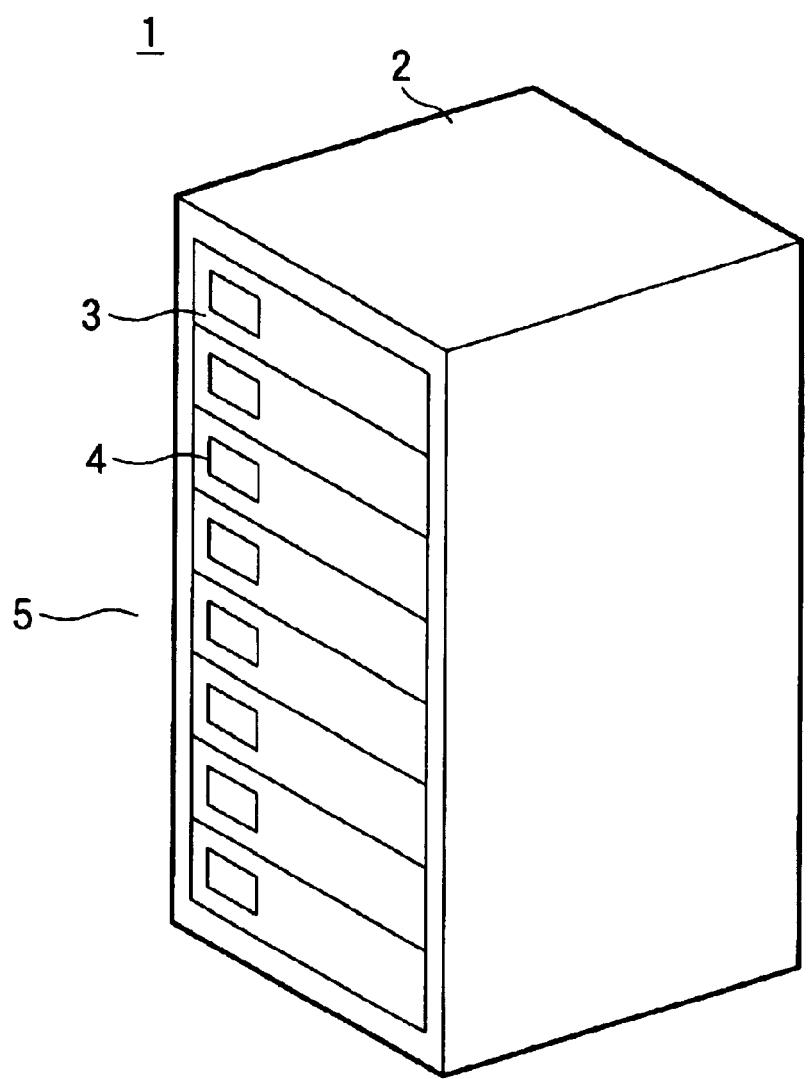
FIG. 1 is a perspective view of electronic equipment of one preferred embodiment of the present invention.

FIG. 1 is a perspective view of electronic equipment of one preferred embodiment of the present invention. As shown, electronic equipment 1 is a server. A cabinet 2 is the external housing of the electronic equipment 1. The cabinet 2 houses a plurality of electronic units 3 stacked (eight stacks of electronic apparatus units 3 are installed in this preferred embodiment). A display 4 is arranged on the front side 5 of each electronic apparatus unit 3. The display 4 presents an indication of whether or not the electronic apparatus unit 3 is powered and an indication of a failure if any cooling device fails.

Figure 2:
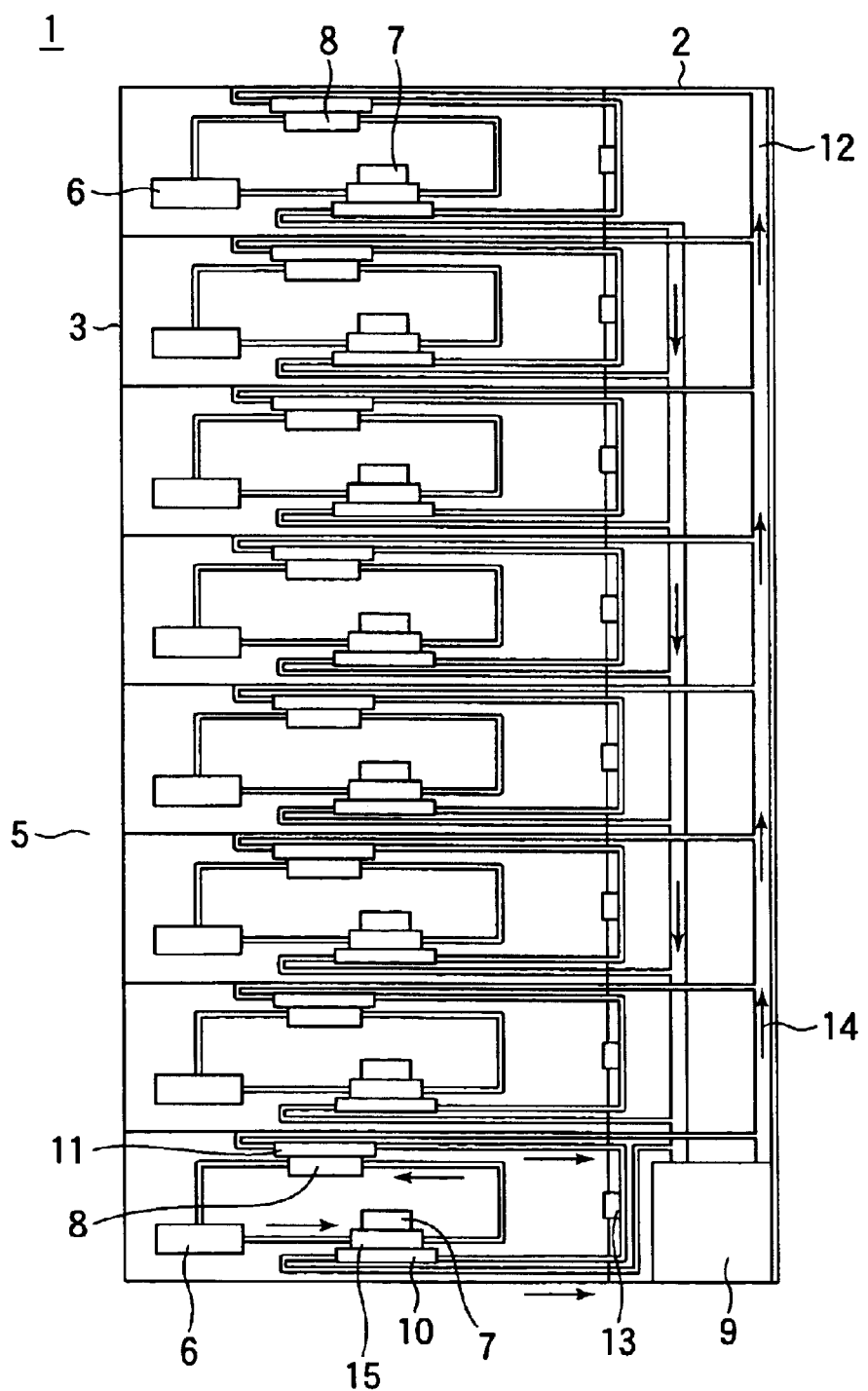
FIG. 2 is a sectional side elevation view of the electronic equipment of FIG. 1.

FIG. 2 is an elevation section of a cooling system installed in the electronic equipment of FIG. 1, viewed from the side thereof.

As shown, the electronic equipment 1 includes a plurality of stacked electronic apparatus units 3 in the cabinet 2. Each electronic apparatus unit 3 has a CPU (Central Processing Unit) 7 generating heat therefrom. Heat emitted from the CPU 7 is conducted away by a cooling jacket 15. A cooling fluid flows in a direction represented by an arrow 14 indicating the direction of circulation. The cooling fluid driven by a micro pump 6 first passes through the cooling jacket 15, exchanges heat with a heat exchanger 8, and then returns to the micro pump 6.

The cabinet 2 houses a fixed piping 12, a first heat receiver 10, a second heat receiver 11, and a large pump 9. When the electronic apparatus unit 3 is loaded into the cabinet 2, a switching valve 13 mounted along the fixed piping 12 in the cabinet 2 is opened. The cooling fluid thus circulates through the electronic apparatus units 3 independently and in parallel.

In the electronic apparatus unit 3, the cooling jacket 15 is thermally in contact with the first heat receiver 10, and the heat exchanger 8 is thermally in contact with the second heat receiver 11. Heat emitted from the CPU 7 in the electronic apparatus unit 3 is thus transferred to the cabinet 2. Heat reaching the cabinet 2 is partly naturally dissipated from the entire surface of the cabinet 2 into the ambient and partly forced out into the ambient by a cooling fan arranged in the cabinet 2.

Since each electronic apparatus unit 3 is independent of the cooling system of the cabinet 2, no cooling fluid leakage takes place when the electronic apparatus unit 3 is loaded or unloaded.

Even if one of the cooling systems fails, there is no need for stopping the electronic equipment. The cooling fluid rises in temperature after passing by a heat generator. The circulation direction of the cooling fluid in the electronic apparatus unit 3 is opposite from the circulation direction 14 of the cooling fluid of the cabinet 2. Since a low temperature portion of the cabinet 2 comes close to a high temperature portion of the electronic apparatus unit 3, a temperature rise in the cooling fluids becomes mild. The reliability of materials forming the cooling system is improved.

Figure 3:
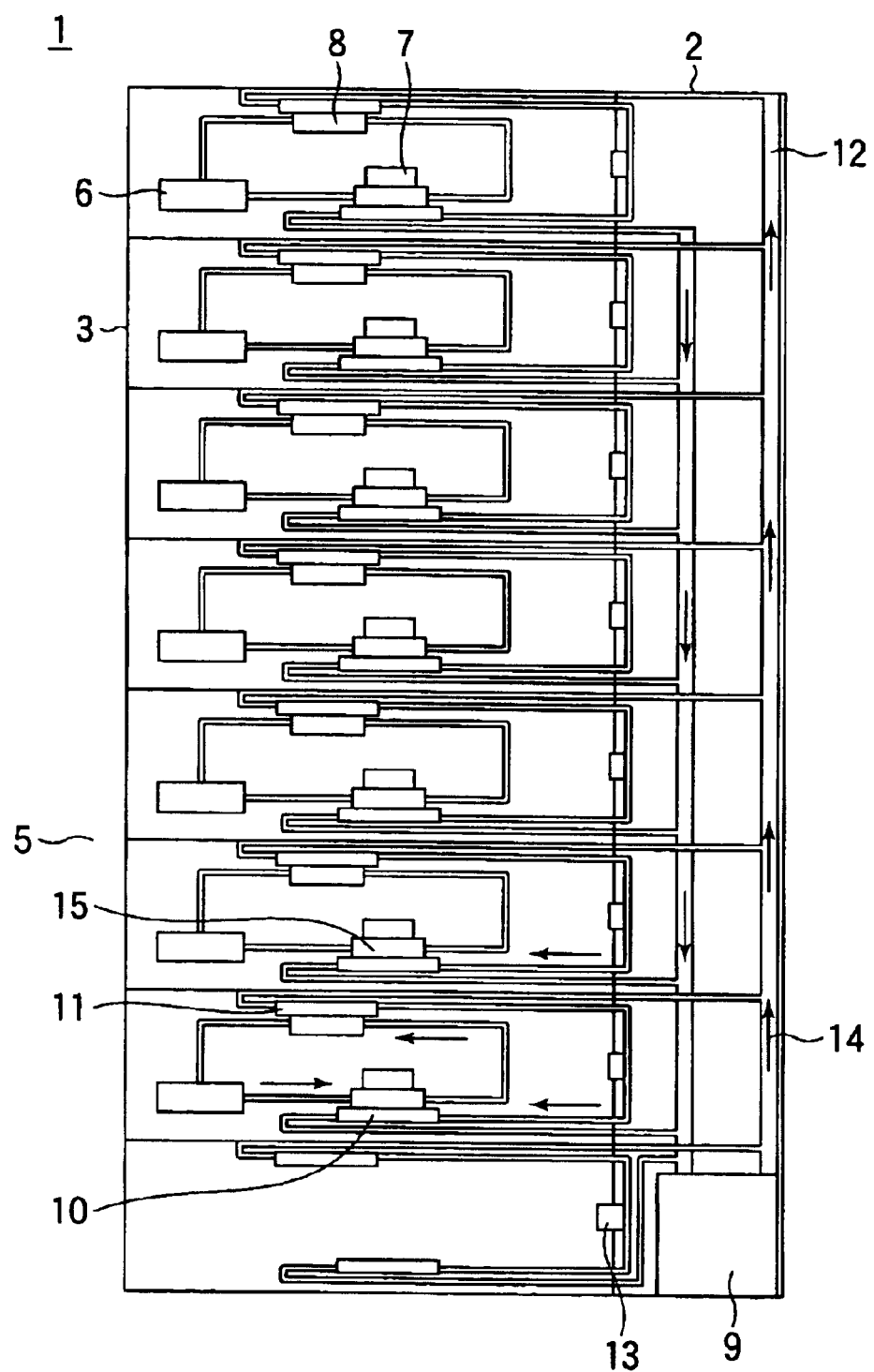
FIG. 3 is a sectional side elevation view of the electronic equipment with a single electronic apparatus removed.

FIG. 3 is a sectional side elevation view of the electronic equipment of FIG. 2 with a single electronic apparatus removed.

If one electronic apparatus unit 3 is not loaded, the switching valve 13 in the fixed piping 12 in the cabinet 2 is closed. The cooling fluid is not circulated from the cabinet 2 to the empty position where no electronic apparatus unit 3 is loaded.

Since no cooling fluid is circuited to a place where no cooling is required, the workload on the large pump 9 is thus reduced. A drop in the speed of the cooling fluid flowing through the piping in the cabinet 2 is prevented. A heat exchange rate is free from reduction.

Figure 4:
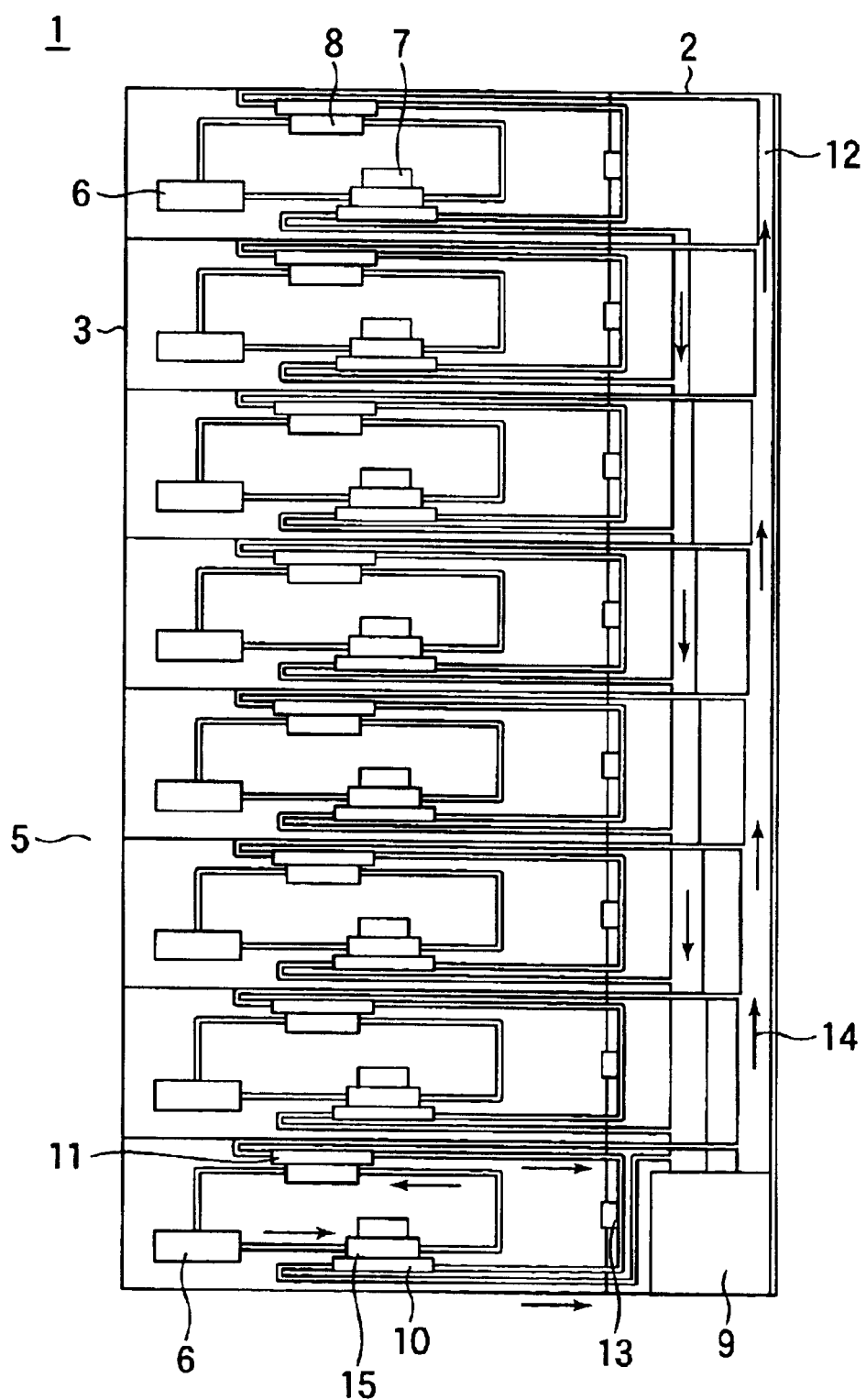
FIG. 4 is a sectional side elevation view of the electronic equipment with the cross-sectional area of the passage of a piping changed.

FIG. 4 is a sectional side elevation view of the electronic equipment with the cross-sectional area of the passage of a piping changed. As shown, the larger the cross-sectional area of the piping, the closer the piping runs to the pump. This arrangement reduces the pressure loss in the piping in the cooling system in the cabinet 2. The amounts of fluid supplied to the electronic apparatus units 3 become uniform.

Figure 5:
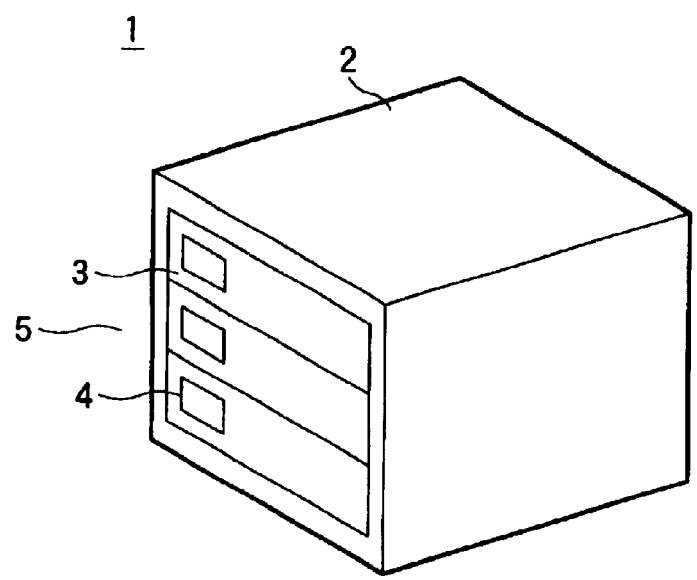
FIG. 5 is a perspective view of an electronic apparatus implementing another preferred embodiment of the present invention.
Figure 6:
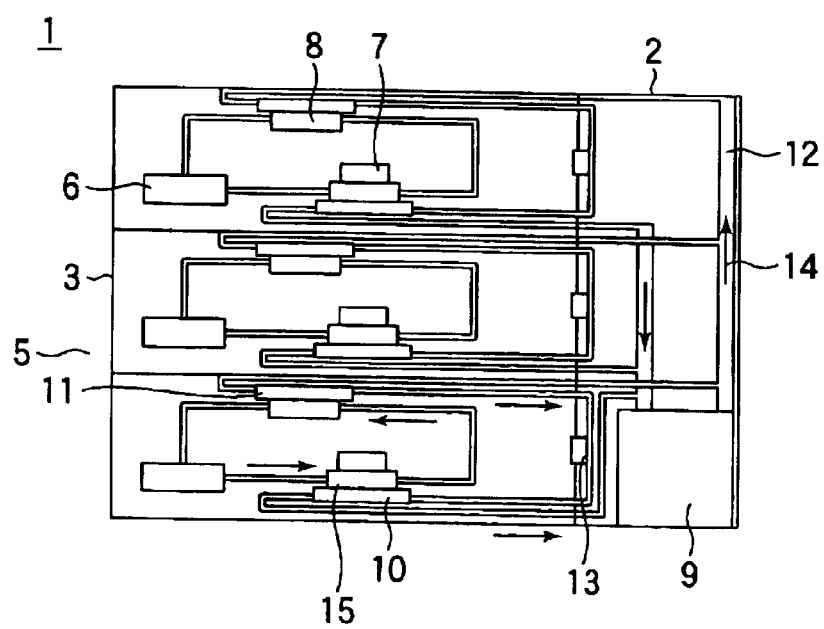
FIG. 6 is a sectional side elevation view of the electronic apparatus of FIG. 5.

FIG. 5 is a perspective view of an electronic apparatus implementing another preferred embodiment of the present invention which accommodates three electronic apparatus units 3 only, different from that shown in FIG. 1. FIG. 6 is a sectional side elevation view of the electronic apparatus of FIG. 5.

As shown in FIGS. 5 and 6, the electronic equipment 1 houses a plurality of electronic apparatus units 3 in the cabinet 2. Each electronic apparatus unit 3 has a CPU 7. Heat emitted from the CPU 7 is drained by the cooling jacket 15. A cooling fluid flows in a direction represented by an arrow 14. The cooling fluid is circulated by the micro pump 6.

The cooling fluid driven by the micro pump 6 first passes through the cooling jacket 15, exchanges heat with a heat exchanger 8, and then returns to the micro pump 6. The cabinet 2 houses a fixed piping 12, a first heat receiver 10, a second heat receiver 11, and a large pump 9.

When the electronic apparatus unit 3 is loaded into the cabinet 2, a switching valve 13 mounted along the fixed piping 12 in the cabinet 2 is opened. The cooling fluid thus circulates through the electronic apparatus units 3 independently and in parallel. In the electronic apparatus unit 3, the cooling jacket 15 is thermally in contact with the first heat receiver 10, and the heat exchanger 8 is thermally in contact with the second heat receiver 11.

Heat emitted from the CPU 7 in the electronic apparatus unit 3 is thus transferred to the cabinet 2. Heat reaching the cabinet 2 is partly naturally dissipated from the entire surface of the cabinet 2 into the ambient and partly forced out into the ambient by a cooling fan arranged in the cabinet 2.

Since the cooling system of the electronic apparatus unit 3 is independent of the cooling system of the cabinet 2, no cooling fluid leakage takes place when the electronic apparatus unit 3 is loaded or unloaded.

Even if one cooling system fails, there is no need for stopping the operation of the electronic equipment.

The cooling fluid rises in temperature after passing by the CPU. The circulation direction of the cooling fluid in the electronic apparatus unit 3 is opposite from the circulation direction 14 of the cooling fluid of the cabinet 2. Since a low temperature portion of the cabinet 2 comes close to a high temperature portion of the electronic apparatus unit 3, a temperature rise in the cooling fluids becomes mild. The reliability of materials forming the cooling system is improved.

Figure 7:
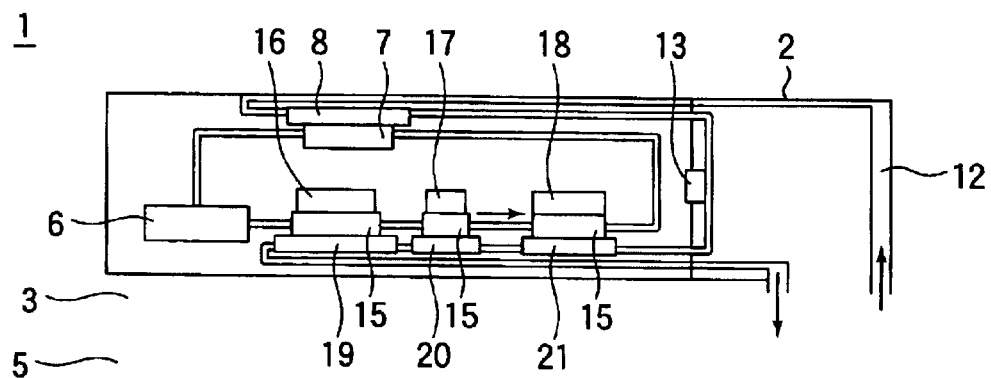
FIG. 7 is a sectional side elevation view of a single electronic apparatus which implements another preferred embodiment of the present invention.

FIG. 7 is a sectional side elevation view of a single electronic apparatus which implements another preferred embodiment of the present invention. As shown, the electronic apparatus unit 3 has three heat generators (a first heat generator 16, a second heat generator 17, and a third heat generator 18). These heat generators 16–18 are different from each other in shape and heat generation rate. Cooling jackets respectively attached to the three heat generators 16, 17, and 18 are thermally in contact with a first heat receiver 19, a second heat receiver 20, and a third heat receiver 21, respectively, mounted on the cabinet 2 to separately perform heat exchange. The cooling fluid flows in a direction represented by an arrow 14. Heat reaching the cabinet 2 is partly naturally dissipated from the entire cabinet 2 into the ambient and partly forced out into the ambient by a cooling fan arranged in the cabinet 2.

Since the cooling system of the electronic apparatus unit 3 is independent of the cooling system of the cabinet 2, no cooling fluid leakage takes place when the electronic apparatus unit 3 is loaded or unloaded.

Even if one cooling system fails, there is no need for stopping the electronic equipment.

The cooling fluid rises in temperature after passing by the CPU. The circulation direction of the cooling fluid in the electronic apparatus unit 3 is opposite from the circulation direction 14 of the cooling fluid of the cabinet 2. Since a low temperature portion of the cabinet 2 comes close to a high temperature portion of the electronic apparatus unit 3, a temperature rise in the cooling fluids becomes mild. The reliability of materials forming the cooling system is improved.

Figure 8:
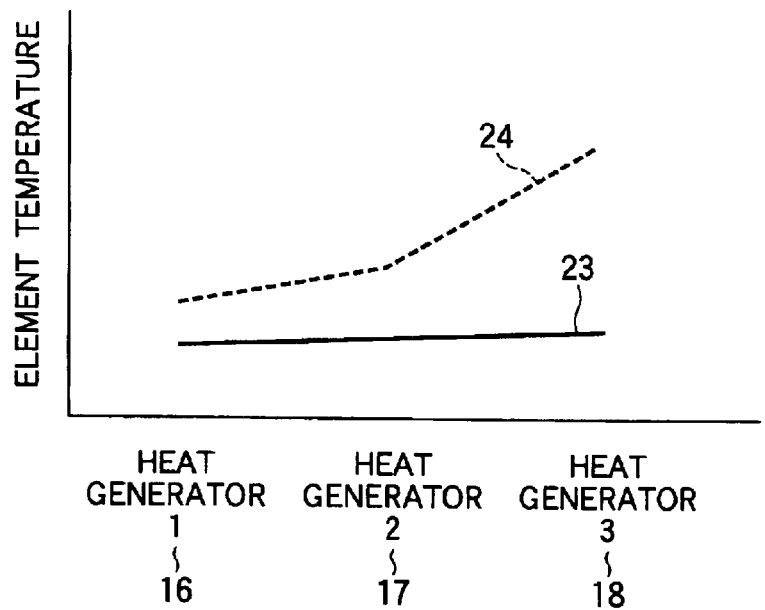
FIG. 8 is a graph plotting the temperature of a CPU of the electronic apparatus of FIG. 7.

FIG. 8 is a graph plotting changes in an element temperature 22 of each of the first heat generator 16, the second heat generator 17, and the third heat generator 18 in the electronic apparatus unit 3 shown in FIG. 7.

As shown, a solid line represent an element temperature of a multi fluid cooling system 23 of the present invention, and a broken line represents an element temperature of a conventional single fluid-cooling system. The multi fluid cooling system 23 maintains the three heat generators at substantially the same element temperature 22. The element temperature 22 becomes higher because of a temperature rise in the cooling fluid as it goes downstream in the conventional single fluid cooling system.

The fluid cooling systems arranged in the electronic apparatuses are thermally coupled to or put into contact with the fluid cooling system arranged in the cabinet in which the electronic apparatuses are installed.

The use of multi cooling systems eliminates the need for stopping the electronic apparatuses even if the fluid cooling system malfunctions due to a failure in the pump. A projection is attached to the electronic apparatus. When the electronic apparatus is loaded into or unloaded from the cabinet, the projection activates the switching valve of the cooling system of the cabinet. The cooling fluid circulates through only the bay having the electronic apparatus loaded therewithin.

Heat generated by the electronic apparatus, reaching the cabinet, is then dissipated into the ambient therefrom. Heat exchange is thus carried out. Even if the cooling system malfunctions due to a failure in the pump, it is not necessary to stop the electronic apparatus. A highly reliable electronic apparatus is thus achieved. When the electronic apparatus is loaded into or unloaded from the cabinet, the switching valve of the cooling system of the cabinet is activated. The cooling fluid circulates through only the bay having the electronic apparatus loaded therewithin. The workload on the pump is reduced, and the cooling fluid is efficiently used.

With ever-increasing requirements on high performance in the electronic apparatus, the amount of heat generated in semiconductor devices becomes larger and larger. A high-performance cooling method is demanded.

For example, a server in a network system houses a plurality of electronic modules in a casing thereof, each electronic module having a CPU and peripheral devices mounted on a wiring board. A plurality of electronic modules having CPUs of high speed and high performance mounted thereon increase the amount of heat generated in electronic equipment.

There is a growing demand for highly reliable and high-performance cooling device and method to efficiently cool such an electronic module.

Still another preferred embodiment of the present invention will now be discussed referring to the drawings.

Figure 9:
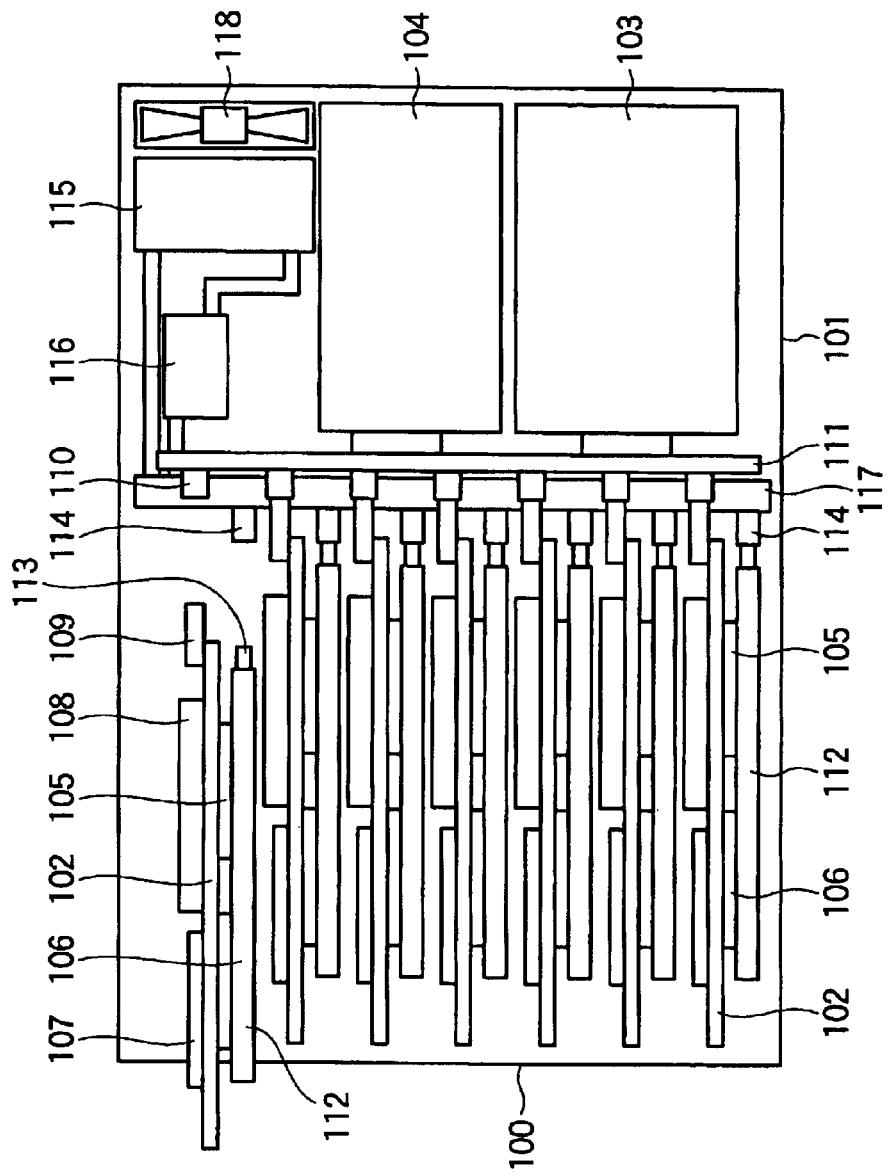
FIG. 9 is a top view illustrating the detail of an internal structure of the electronic equipment of another preferred embodiment of the present invention.

FIG. 9 is a top view illustrating the detail of an internal structure of the electronic equipment of the preferred embodiment of the present invention. This preferred embodiment provides a cooling device circulating a cooling fluid appropriate for allowing an addition of a new electronic module or a corrective action to make easy. In this preferred embodiment, the present invention is applied to a server used in a network system, particularly, a so-called blade server in which a plurality of high-speed and high-performance computers (electronic modules) are included. As is apparent to those skilled in the art, the present invention is not limited to the server.

As shown in FIG. 9, a housing 100 having a predetermined shape is fabricated of steel or plastic. Electronic equipment 101 is produced by mounting a plurality of wiring boards (electronic modules) 102, a control board module 103, a power supply module 104, etc. in the housing 100. Each of the wiring boards 102 have a CPU 105, as a heat generating element, a plurality of heat generating elements 106 and 107, a hard disk 108, etc. The wiring board (electronic module) 102 itself constitutes a computer. In the server, the wiring board 102 is handled as a unit in the housing 100 in the loading and unloading operation or maintenance of the sever.

The wiring board 102 includes, at one side thereof (on the right end in FIG. 9), a connector 109 for electrical connection. By mating the connector 109 with a connector 110 mounted on a mother wiring board 111, electrical connection is established between the control board module 103 and the power supply module 104. The mother wiring board 111 provides electrical connection between the plurality of wiring boards 102, the control board module 103, and the power supply module 104, etc.

A cooling jacket 112 is mounted on the other side of each of the wiring boards 102, namely, on the top of the CPU 105, and other heat generating elements 106 and 107. A thermally conductive sheet is interposed between the cooling jacket 112 and the CPU 105 and other heat generating elements 106 for thermal coupling. A fluid connector 113 is arranged on the right hand side of the cooling jacket 112 as shown in FIG. 9, right below the connector 109 on the wiring board 102 for electrical connection. By mating the fluid connector 113 with another fluid connector 114, the cooling jacket 112 is connected with the fluid circulation loop to be discussed later.

As shown, the fluid circulation loop includes a cooling fan 118, a heat exchanger 115, a fluid circulator 116 such as a pump, and a header 117. A plurality of fluid connectors 114 are arranged on the header 117 at locations corresponding to the mounting positions of the plurality of wiring boards 102 in the housing 100.

Figure 10:
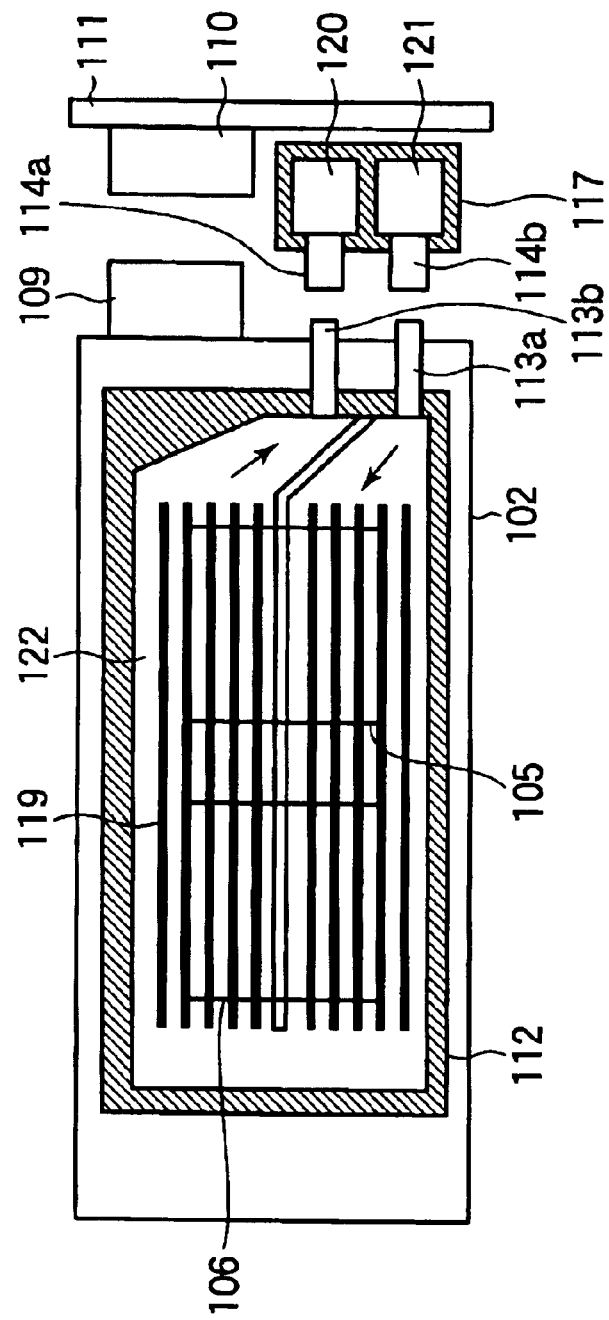
FIG. 10 is a sectional view illustrating the detail of an internal structure of a cooling jacket and a header in the electronic equipment.

FIG. 10 is a sectional view illustrating the detail of an internal structure of the cooling jacket 112 and the header 117. The cooling jacket 112 is a planar structure fabricated of a metal, such as copper or aluminum, excellent in thermal conductivity and workability. A U-shaped fluid passage 122 for the cooling fluid is formed within the cooling jacket 112. A plurality of fins 119 are arranged along the fluid passage. Fluid connectors 113a and 113b are arranged in an inlet and an outlet of the fluid passage 122 of the cooling jacket 112. The cooling jacket 112 may be fabricated of a corrosion resistant material such as stainless steel if a corrosion taking place over long time use is a concern, although the degree of corrosion also depends on the cooling fluid.

The header 117 is split into two passages, an input passage 120 and an output passage 121. Fluid connectors 114a and 114b are arranged at positions corresponding to the mounting positions of the plurality of cooling jackets 112 (wiring boards 102). In this arrangement, a plurality of passages of the cooling fluid in the cooling jackets 112 are connected in parallel. More specifically, the fluid connectors 114a and 114b of the header 117 are respectively connected to the fluid connectors 113a and 113b arranged on the cooling jacket 112. By mating the fluid connectors 113a and 113b with the fluid connectors 114a and 114b, the passage of the cooling jacket 112 is hydraulically coupled to the passage of the header 117.

Each of the fluid connectors 113a and 113b, and the fluid connectors 114a and 114b, of male and female types, is provided with a valve. When the fluid connectors are not mated, the valve is closed. When the fluid connectors are mated, the valve on both sides are opened to allow the cooling fluid to pass therethrough. In this way, even if the wiring board 102 is loaded or unloaded in the middle of the operation of the system, the cooling fluid is prevented from leaking out of the passages during the loading or unloading operations. Without suspending the operation of the system, a maintenance job including replacement and removal of the wiring board 102 and addition of a new wiring board 102 in the electronic equipment 101 is safely and easily performed. A sufficient margin is preferably allowed in the mating length of each of the connectors 109 and 110 for electrical connection and the fluid connectors 113 and 114. This is intended to reliably perform electrical connection and disconnection to the mother wiring board 111, and to perform reliable hydraulic coupling and decoupling between the cooling jacket 112 and the fluid circulation loop, without any leakage of the cooling fluid when the wiring board 102 is loaded or unloaded.

The fluid resistance to the cooling fluid in the cooling jacket 112 is preferably maximized in the fluid circulation loop. More specifically, if the fluid resistance in the cooling jacket 112 becomes predominant over the fluid resistance in the overall fluid circulation loop, the amounts of cooling fluid distributed among the plurality of cooling jackets 112 are equalized, and the plurality of cooling jackets 112 are uniformly cooled. The wiring board 102 may be mounted at any location within the housing 100 of the electronic equipment 101. A detector such as a switch may be arranged to detect the number of mounted wiring boards 102 within the electronic equipment 101, and the output of the cooling fluid from the fluid circulator 116 or cooling power of the cooling fan 118 (such as the number of revolutions of the cooling fan 118) may be controlled, depending on the number of the mounted wiring boards 102. A bypass passage may be arranged to connect the input passage 120 to the output passage 121 in the header 117, and the flow rate of the cooling fluid passing through the bypass passage may be controlled (by a flow-rate variable valve, for example) depending on the number of mounted wiring boards 102. In these arrangements, the amount of cooling fluid supplied to the cooling jackets 112 is made uniform regardless of the number of mounted wiring boards 102.

Figure 11:
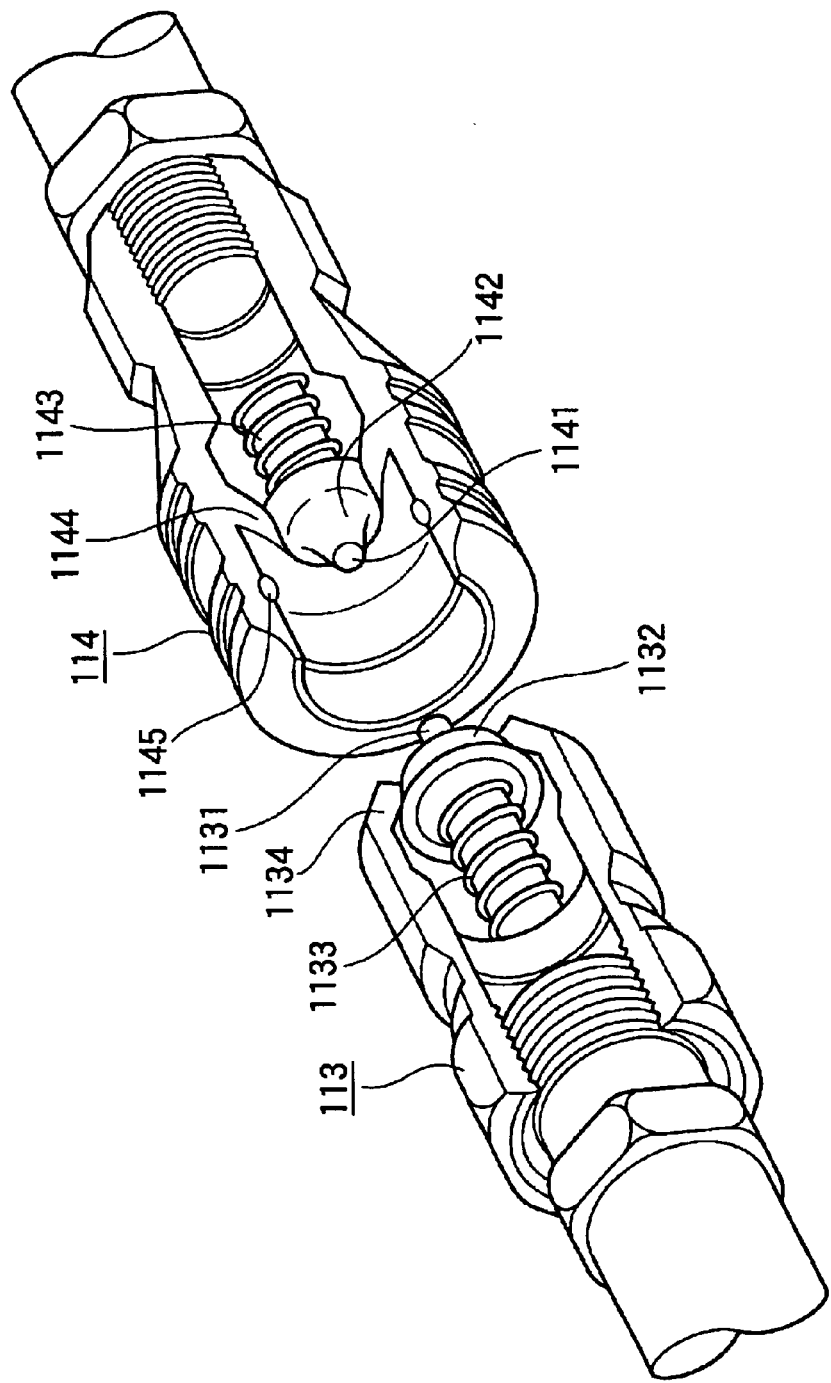
FIG. 11 is a perspective view showing the structure of a fluid connector of the cooling jacket and the header in the electronic apparatus, partly broken away to reveal the interior thereof.

FIG. 11 illustrates in detail the structure of the fluid connectors 113 and 114. The fluid connectors 113 and 114, generally conical in shape, include valve bodies 1132 and 1142 having projections 1131 and 1141, respectively. The valve bodies 1132 and 1142 are urged toward valve seats 1134 and 1144 by springs 1133 and 1143 (equal to each other in repulsive force), respectively. Normally, the fluid connectors 113 and 114 are closed. When the fluid connector 113 is inserted into the fluid connector 114, the valve bodies 1132 and 1142 push each other in a balanced state with the projections 1131 and 1141 abutting each other, and are thus separated from the valve sheets 1134 and 1144 in an open state, respectively. An O ring 1145 assures liquid-tightness between the connectors 113 and 114.

In the electronic equipment 101 thus constructed, each of the wiring boards 102 is detachably mounted. In the loading or unloading operation, the electrical connection or disconnection of the wiring board 102 to the mother wiring board 111 is performed while the hydraulic coupling or decoupling of the cooling jacket 112 with the fluid circulation loop is performed at the same time. The fluid circulation loop is supplied with water or antifreeze liquid (antifreeze mixture). The cooling fluid is circulated by the fluid circulator 116 between the cooling jacket 112 and the heat exchanger 115.

Heat of the wiring board 102 (generated by the CPU 105 and other heat generating elements 106), absorbed by the cooling jacket 112, is transported to the heat exchanger 115 arranged in the housing 100, and is then forced out into the ambient by the cooling fan 118. Air stream in the electronic equipment 101 caused by the cooling fan 118 may run between the wiring boards 102 to cool the other heat generating element 107, the hard disk 108, etc., which are not thermally coupled to the cooling jacket 112. The fluid circulator 116 circulates cooling fluid cooled by the heat exchanger 115 back to the cooling jacket 112 in the wiring board 102 through the header 117. The fluid circulator 116, if not high temperature resistant, is preferably installed downstream of the heat exchanger 115.

Heat generated from the heat generating element mounted on each of the plurality of wiring boards 102 in the electronic equipment 101 is collected by the heat exchanger 115, and the cooling fan 118 dissipates heat from there. This arrangement allows the heat exchanger 115 to be miniaturized and to function with a low airflow rate of the cooling air.

Figure 12:
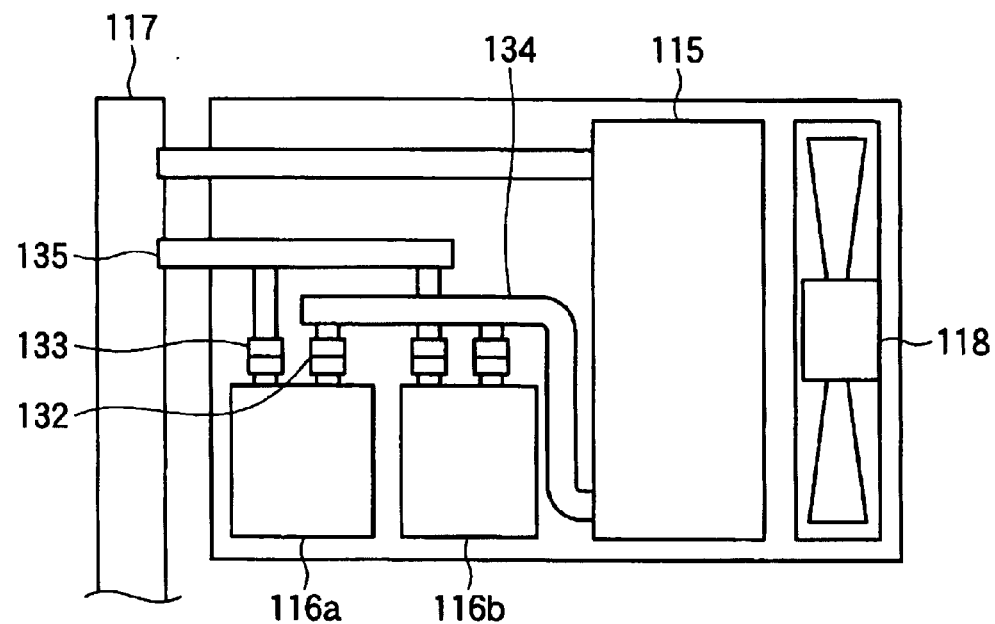
FIG. 12 illustrates a modification of a fluid circulation loop in the electronic equipment.

FIG. 12 illustrates a modification of the fluid circulation loop in the electronic equipment of the preferred embodiment of the present invention. In the modification of the preferred embodiment shown in FIG. 12, a plurality of pumps 116 of FIG. 9 (two pumps 16 here) are used to assure redundancy. The pumps 116a and 116b are detachably connected to a pump inlet header 134 and a pump outlet header 135 through fluid connectors 132 and 133 housed in each valve. Connectors for supplying power to the pumps 116a and 116b, although not shown, are also detachably connected as the fluid connectors 132 and 133. The fluid connectors 132 and 133 and the electrical connectors may be mated or demated at the same time. The pump inlet header 134 and the pump outlet header 135 are respectively connected to the heat exchanger 115 and the fluid supplying header 117 leading to the cooling jacket mounted on each wiring board 102. The fluid connectors 132 and 133 have respective valves, regardless of a male or female type. When the fluid connectors are not connected, the valves are closed. When the fluid connectors are connected to each other, the valves are open to allow the cooling fluid to flow therethrough.

The fluid circulation loop having redundancy is free from fluid leakage even when one pump is disconnected from the fluid circulation loop in the event of a failure of the one pump. During the maintenance of the electronic equipment 101, the pump is safely and easily replaced without stopping the operation of the system.

Figure 13:
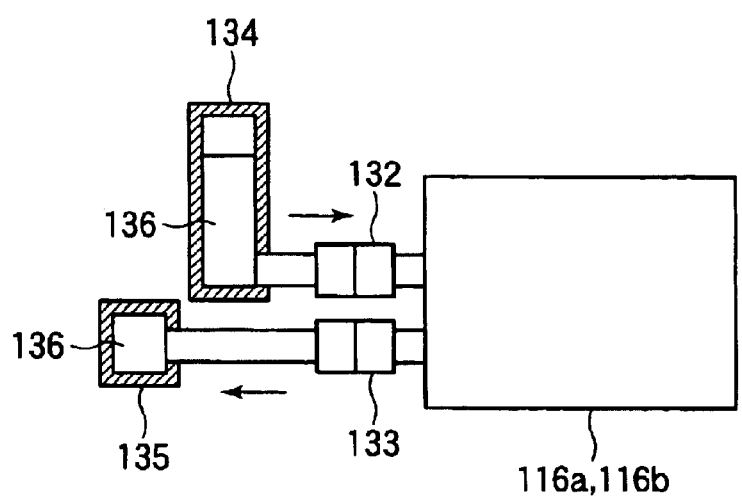
FIG. 13 illustrates the operational principle of the fluid circulation loop of FIG. 12.

The amount of cooling fluid enclosed the fluid circulation loop must be determined taking into consideration the amount of fluid that may be transmitted in evaporation through the surfaces of the members forming the passage of the circulation (for example, the pump, the fluid connectors, the cooling jackets, the headers, the heat exchanger, the piping, and the junctions therebetween) during long time use. A reserve tank having a capacity corresponding to the amount of transmitted fluid must be arranged along the passage of the cooling fluid. As shown in FIG. 13, the pump inlet header 134 having an enlarged capacity may be used as a reserve tank. As a cooling fluid 136 is transmitted, air collects in the top portion of the inside of the pump inlet header 134, also serving as one reserve tank, and thus the pump inlet header 134 is preferably connected to each of the pumps 116a and 116b at a lower level as shown.

As shown in FIG. 14, the pumps 116a and 116b, the heat exchanger 115, the headers 134 and 135, and the cooling fan 118 forming the fluid circulation loop may be modularized into a unitary body (as a unit 137). The unit 137 is thus detachably connected to the header 117 through fluid connectors 138a, 138b, 139a, and 139b, each having its own internal valve. As in the other fluid connectors, the internal valves are closed when these fluid connectors are not connected to each other. When the fluid connectors are connected to each other, the internal valves are opened, thereby allowing the cooling fluid to pass therethrough. The heat exchanger 137 is safely and easily installed to or removed from the housing 100, and ease of maintenance of the electronic equipment 101 is assured.

Figure 15A:
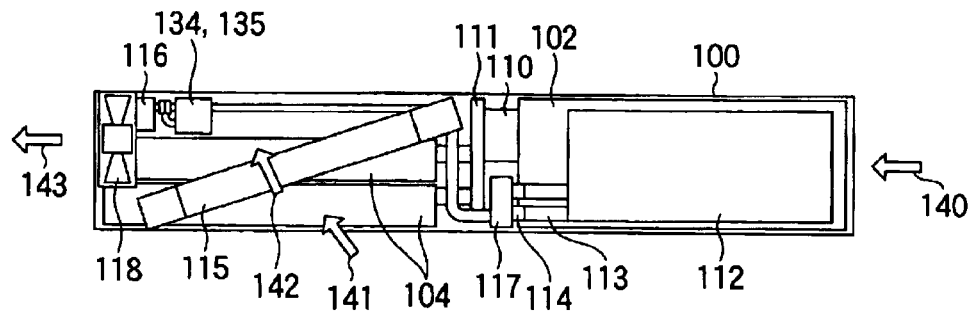
FIG. 15A is a side view of the electronic equipment of another modification.
Figure 15B:
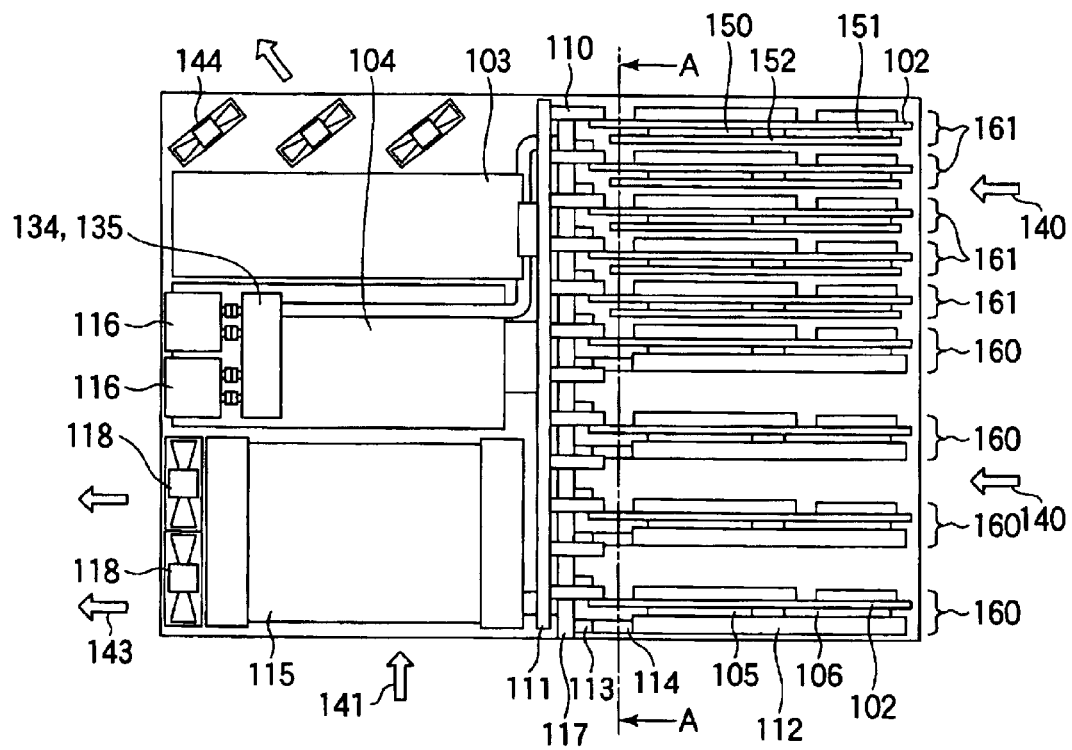
FIG. 15B is a top view of the electronic equipment.
Figure 15C:
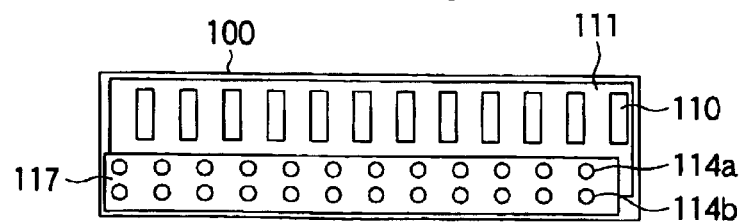
FIG. 15C is a sectional view of the electronic equipment taken along line A—A in FIG. 15B.

FIGS. 15A–15C illustrate a blade server which includes a plurality of electronic modules having a cooling structure of a preferred embodiment of the present invention. As shown, elements identical to those discussed in connection with the above preferred embodiment are designated with the same reference numerals. In the preferred embodiment shown FIGS. 15A–15C, a number of air-cooled wiring boards (electronic modules) 161 is arranged in addition to water-cooled wiring boards (electronic modules) 160.

As shown, the heat exchanger 115 is arranged at an inclined position in the housing 100 as shown in FIG. 15A, thereby forming an air inlet space and an air outlet space. With the cooling fans 118 rotating, air flows along arrows 140–143. Through a plurality of slits (not shown) formed in the front, side, and back surfaces of the housing 100, air is introduced into the interior of the housing 100 of the electronic equipment 101, passes through the heat exchanger 115 which cools water-cooled wiring boards 160 intensively and efficiently, and is then discharged through the back surface of the housing 100.

Other cooling fans 144 are arranged in the housing 100. Air introduced from the front by the cooling fan 144 flows mainly between the air-cooled wiring boards 161, thereby directly cooling heat generating elements mounted on the air-cooled wiring board.

In this preferred embodiment of the present invention, a plurality of fans 118 and a plurality of pumps 116 are employed, thereby assuring redundancy. More specifically, replacement of wiring boards is performed without the need for stopping the operation of the system. The cooling fan 118 and the pump 116 may be replaced through the back side of the electronic equipment 101 (the left side of the electronic equipment 101 in FIGS. 15A–15C). A filter is arranged in a place where the flow speed of the cooling fluid is the slowest in the fluid circulation passage, i.e., inlet headers 134 and 135 of the pump 116. Furthermore, a plurality of power supply modules 104 and a plurality of control wiring board modules 103 are employed to assure redundancy.

FIG. 15C is a sectional view of the electronic equipment taken along line A—A in FIG. 15B, showing a layout of the header 117 and the fluid connectors 114*a* and 114*b* thereof, and the mother wiring board 111 and the electrical connector 110 thereof. As shown, the fluid connectors 114*a* and 114*b*, arranged at regular intervals, are close (adjacent) to corresponding electrical connectors 110. In this arrangement, the water-cooled wiring boards 160 and the air-cooled wiring boards 161 are arranged at any position in a mixed fashion. Typically, a high-performance and high-speed CPU generating high temperature heat is mounted on the water-cooled wiring board 160, and a CPU not generating high temperature heat is mounted on the wiring board 161. The cooling method is thus selected between fluid cooling and air cooling depending on the amount of heat generated by an electronic module to be mounted. Efficient mounting is thus implemented in a housing having relatively a small space available inside. A heat sink 152 may be further arranged on the air-cooled wiring board 161.

Figure 16:
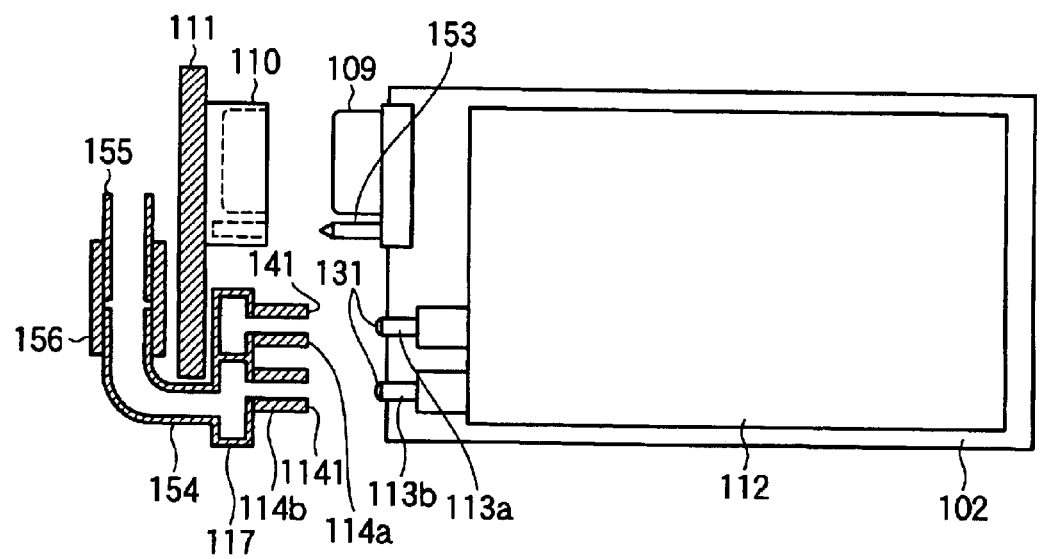
FIG. 16 illustrates a water-cooled wiring board of the electronic apparatus of FIG. 7 in a partly cross section.

FIG. 16 illustrates, more in detail, the water-cooled wiring board 102 of the preferred embodiment of the present invention. A cooling jacket 112 is thermally coupled to one side of the water-cooled wiring board 102. Fluid connectors 113*a* and 113*b* are connected to one edge of the cooling jacket 112. Each of the fluid connectors 113*a* and 113*b* is terminated with a tapered face 131. Likewise, each of fluid connectors 114*a* and 114*b* on the header 117 are also preferably terminated with a tapered face 141. An electrical connector 109 is arranged on the wiring board 102. A guide pine 153 extends from the wiring board 102 adjacent to the connector 109. When the wiring board 102 and the cooling jacket 112 are installed with the connector 109 and the fluid connectors 113*a* and 113*b* respectively inserted into the connector 110 on the mother wiring board 111 and the fluid connectors 114*a* and 114*b* on the header 117, dimensional errors and positional error of the wiring board 102 are accommodated by the guide pin 153 and the tapered face 131. The wiring board 102 is thus smoothly connected electrically and hydraulically.

When the water-cooled wiring board 102 is installed, the cooling fluid is preferably introduced beforehand into the cooling jacket 112 already attached to the wiring board 102. In this way, air is prevented from entering the flow passage of the fluid circulation loop to be subsequently formed.

The wiring board 102 together with the cooling jacket 112 is inserted into the connector 110 of the mother wiring board 111 and the fluid connector 114 of the header 117 in the following order: 1) during insertion, the electrical connection is made earlier, and during removal, the electrical connection is broken earlier (for example, the distance between the end of the female electrical connector and the end of the male electrical connector is set to be shorter than the distance between the end of the female fluid connector and the end of the male fluid connector), or 2) during the insertion, the fluid coupling is made earlier, and during the removal, the electrical connection is broken earlier (for example, the distance between the end of the female fluid connector and the end of the male fluid connector is set to be shorter than the distance between the end of the female electrical connector and the end of the male electrical connector).

In one of advantages of the procedure 1), a circuit (such as a CPU) on the wiring board 102 is activated to sense whether the cooling fluid runs through the wiring board 102, and if no cooling fluid is running, a signal is sent to the electronic equipment 1 (the control board module 3 in FIG. 15B) to keep the wiring board 102 from starting. In one of advantages of the procedure 2), the circuit of the wiring board 102 is started (with heat generating) after the circulation of the cooling fluid in the wiring board 102 is stabilized, and certain cooling performance is reached. During the removal, the fluid passage is disconnected subsequent to the stop of heat generation.

As for the connection order of the inlet connector and the outlet connector of the fluid connectors, the outlet connector from the cooling jacket 112 is connected first when the wiring board 102 is loaded. When the wiring board 102 is demounted, the inlet connector to the cooling jacket 112 is disconnected first. The advantage of such a procedure is that leakage of the cooling fluid is reliably avoided because the outlet connector is always connected at the moment pressure is applied to the cooling jacket (i.e., the inlet connector is connected).

The CPU mounted on the wiring board 102 is preferably arranged upstream of the passage of the cooling jacket because the cooling fluid at a low temperature thereof cools the CPU effectively. The electrical connector is preferably arranged above the fluid connector so that the cooling fluid, if leaked, does not spill on an electrical circuit mounted on the wiring board. A piping as a passage is preferably fabricated of a metal rather than a flexible tube taking into consideration the transmission of the cooling fluid filling the piping for long time use. To connect the metal pipings 154 and 155, the metal pipings 154 and 155 are engaged with each other with the end portions thereof covered with a flexible tubing. This arrangement reduces the transmission of the enclosed cooling fluid while still providing flexibility at the junction therebetween.

Figure 17:
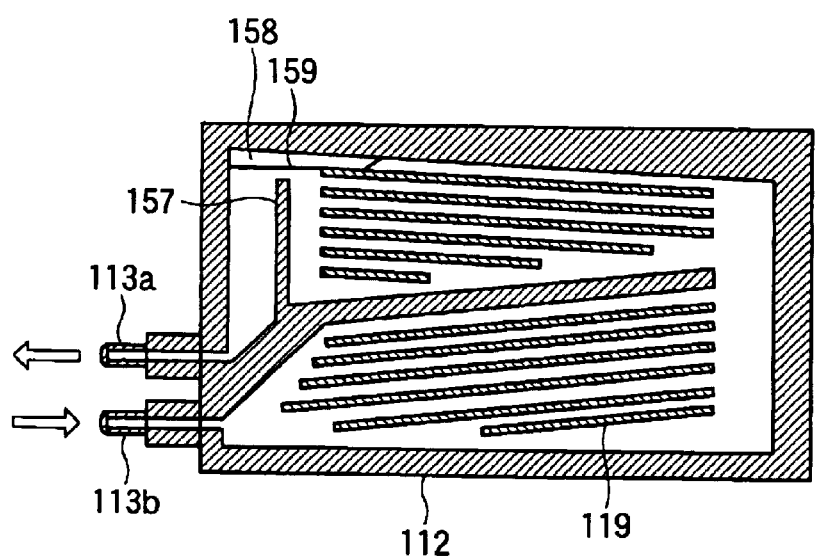
FIG. 17 is a sectional view illustrating the internal structure of the cooling jacket of the electronic apparatus of FIG. 7.

FIG. 17 is a sectional view illustrating the internal structure of the cooling jacket 112. Like the one shown in FIG. 10, the cooling jacket 112 has a planar structure fabricated of a metal, such as copper or aluminum, excellent in thermal conductivity and workability, or a metal, such as stainless steel excellent in corrosion resistance. A plurality of fins 119 are arranged in the passage. The passage formed in the cooling jacket 112 rises upward as the passage goes downstream. The fins 119 are included so that the fins 119 rise upward as the passage goes downstream. A damming plate 157 is arranged inside the cooling jacket 112. Air 158, if included inside, reliably collects in area 158 inside the cooling jacket 112 which does not contribute to heat dissipation.

Fluid level 159 does not fall below the upper edge of the damming plate 157. Air, if included further, is discharged out of the cooling jacket 112. Air, if introduced in the cooling jacket 112 for any reason, does not remain in an area inside the cooling jacket 112 that contributes to heat dissipation, and is discharged out of the cooling jacket 112 before adversely affecting heat dissipation performance thereof.

When the electronic module (the wiring board) 102 is loaded into or unloaded out of the electronic apparatus, hydraulic coupling and decoupling with the cooling system (the cooling fluid circulation loop) are performed when electrical connection with the electronic apparatus is made or broken. The loading and unloading of the wiring board 102 are possible even in the middle of the operation of the electronic apparatus without the need for stopping the operation of the system. Since the coupling between the wiring board 102 and the cooling system is performed through the fluid connectors having the built-in valves, the loading and unloading of the wiring board 102 are easily and safely performed without leakage of the enclosed cooling fluid.

Figure 18:
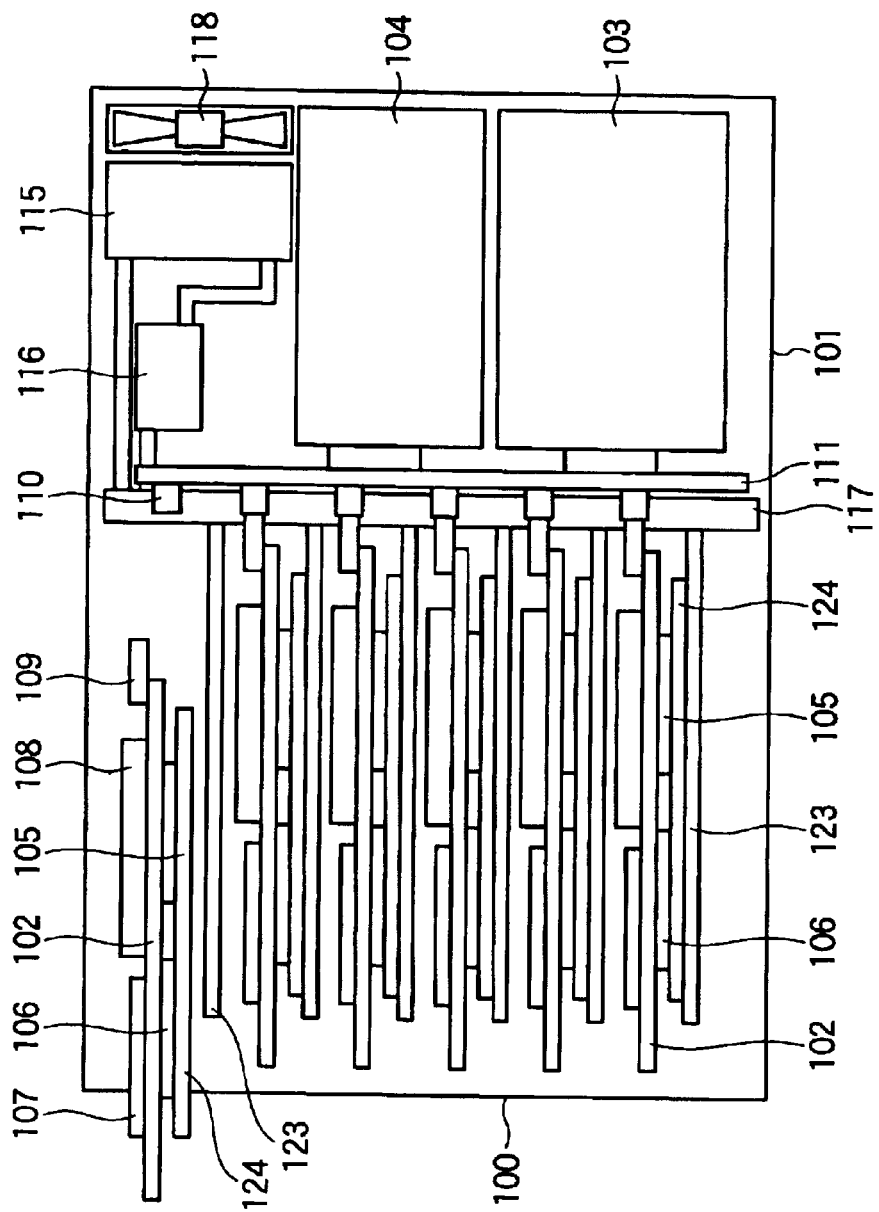
FIG. 18 is a top view illustrating in detail the internal structure of the electronic equipment in accordance with another embodiment of the present invention.

FIG. 18 is a top view illustrating in detail the internal structure of the electronic equipment in accordance with another preferred embodiment of the present invention. The electronic equipment has a thermal coupling between a wiring board and a fluid circulation loop different from the thermal coupling described above. The rest of the structure of the electronic equipment is identical to the one shown in FIG. 9.

The housing 100 of the electronic equipment 101 has a plurality of cooling plates 123 at locations corresponding to the mounting positions of the wiring boards (electronic modules) 102. As the cooling jackets 112 are mounted as shown in the preferred embodiment shown in FIG. 9, the plurality of cooling plates 123 are arranged in the housing 100. The wiring board 102 is thermally coupled to the cooling plate 123.

Each cooling plate 123 also has a fluid passage inside and is secured to the header 17. Each cooling plate 123 thus forms a part of the fluid circulation loop. The fluid passages of the cooling plates 123 are connected in parallel. The enclosed cooling fluid is supplied into the cooling plate 123 through the output passage 121 (see FIG. 10) of the header 117 and then return to the input passage 120 (see FIG. 10) of the header 117. The cooling fluid thus circulates.

Also arranged on the wiring board 102 is a heat conductor 124, made of copper or aluminum excellent in heat conductivity, thermally coupled to heat generating elements mounted on the wiring board 102. The wiring board 102 is detachably mounted in the electronic equipment 101. As shown, the connector 109 is mated with the connector 110 of the mother wiring board 111 for electrical connection, while the heat conductor 124 is put into contact with cooling plate 123 for thermal coupling with the fluid circulation loop.

Figure 19:
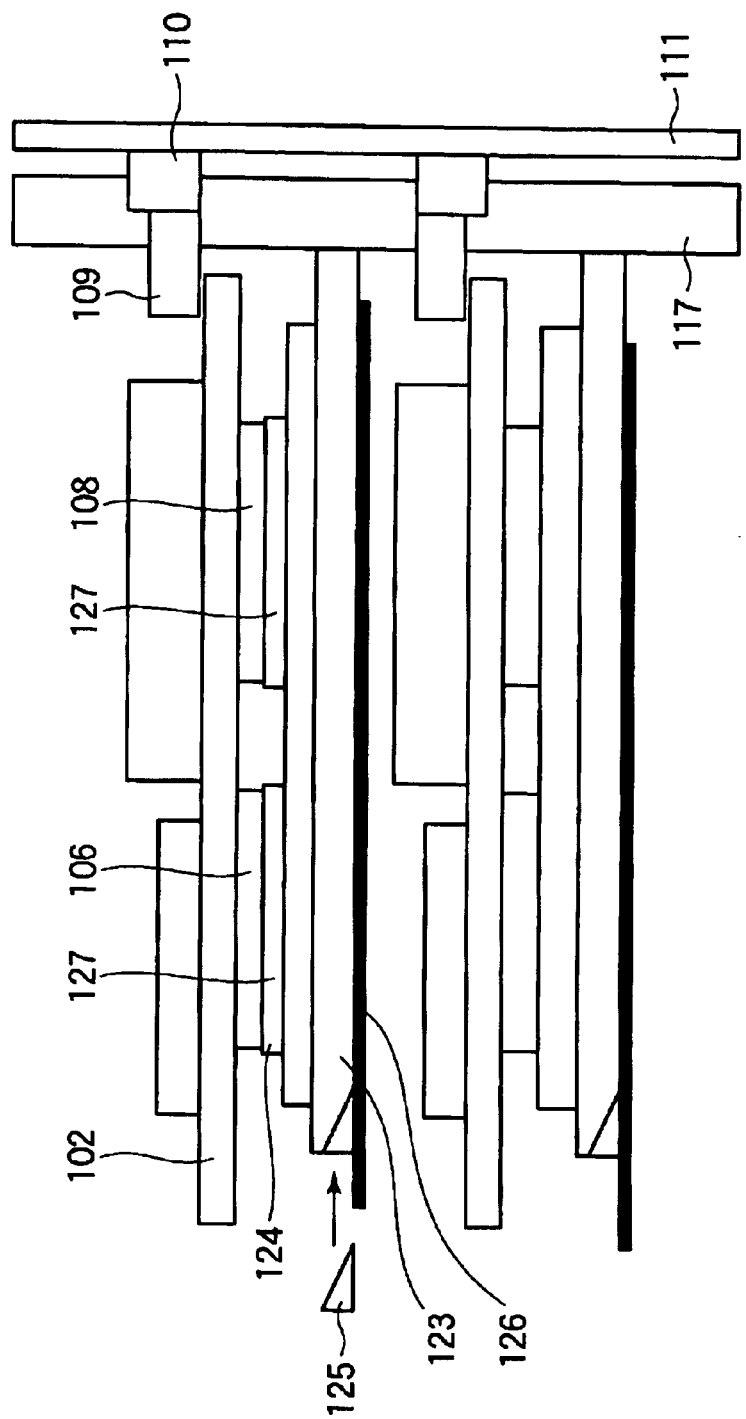
FIG. 19 is an enlarged view illustrating a thermal coupling unit in each wiring board in the electronic equipment of the embodiment.

FIG. 19 is an enlarged view illustrating a thermal coupling portion in each wiring board in the electronic equipment of the preferred embodiment shown in FIG. 18. The heat conductor 124 is thermally coupled to the heat generating elements 105 and 106 such as the CPU through a thermally conductive sheet 127. Heat generated by the heat generating element is conducted to and spread in the heat conductor 124, and is then conducted to the cooling fluid in the cooling plate 123 through contact with the cooling plate 123. In this cooling structure, heat generated by the heat generating elements is spread in the heat conductor 124, and is then conducted away to the cooling plate 123. Heat is thus dissipated from a wide area. An efficient cooling system is achieved.

A fixed wall 126 is arranged beforehand in the housing 100. After the wiring board 102 is mounted in the electronic equipment 101 for connection, a tapered member 125 is preferably inserted between the fixed wall 126 and the cooling plate 123. With this arrangement, the tapered member 125 presses the cooling plate 123 against the heat conductor 124. Contact, i.e., a thermal coupling between the cooling plate 123 and the heat conductor 124 is thus improved. In other words, the two elements are thermally coupled through a small thermal resistance. The tapered member 125 may be engaged and disengaged in interlocking motion with the loading and unloading of the wiring board 102, respectively. In this arrangement, the electrical connection of the connector 109 of the wiring board 102 to the connector 110 of the mother wiring board 111 and the engagement of the cooling plate 123 to the heat conductor 124 are performed in one action. A thermally conductive grease or a thermally conductive sheet may be interposed between the cooling plate 123 and the heat conductor 124, as necessary.

Figure 20:
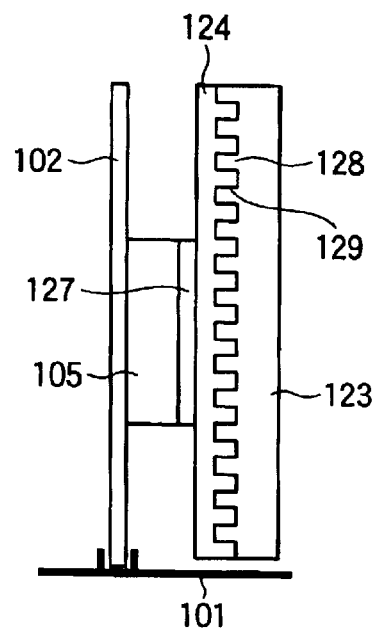
FIG. 20 is a top view of a contact structure between a water-cooled plate and a heat conductor shown in FIGS. 18 and 19.

FIG. 20 is a top view of another contact structure between the cooling plate 123 and the heat conductor 124 shown in FIGS. 18 and 19 in accordance with another preferred embodiment of the present invention. The cooling plate 123 and the heat conductor 124 have respectively fins 128 and fins 129, which are engaged with each other. This arrangement increases the contact area between the cooling plate 123 and the heat conductor 124, thereby reducing a thermal resistance therebetween.

Figure 21A:
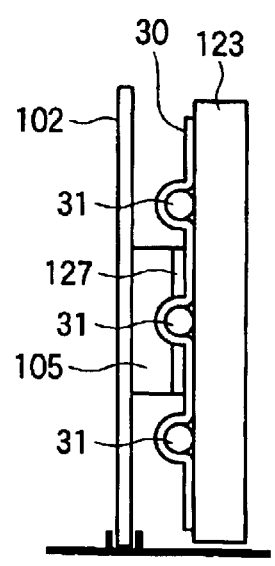
FIGS. 21A and 21B are a side view and a top view of another contact structure between the water-cooled plate and the heat transfer plate shown in FIGS. 18 and 19.
Figure 21B:
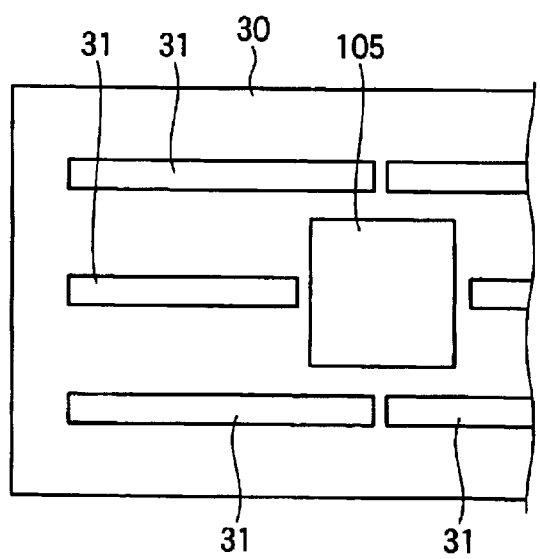

FIGS. 21A and 21B show another thermal conductor 30. As shown, a heat piping 31 is mounted on one surface of the thermal conductor 30. Heat generated by a heat generating element 105 in contact with the surface thus spreads over the surface of the thermal conductor 30. With heat spread over, the thermal conductor 30 in a wide area engages with the cooling plate 123. Heat is thus efficiently conducted to the cooling plate 123.

Another structure may be used instead of the structure for mounting the heat piping 31 onto the thermal conductor 30 shown in FIGS. 21A and 21B. For example, a groove is formed in a U-shape configuration on the thermal conductor 30, and the heat piping 31 may be fitted into the groove. The number of heat pipings 31 is determined depending on the amount heat generated by the heat generating element 105.

Figure 22:
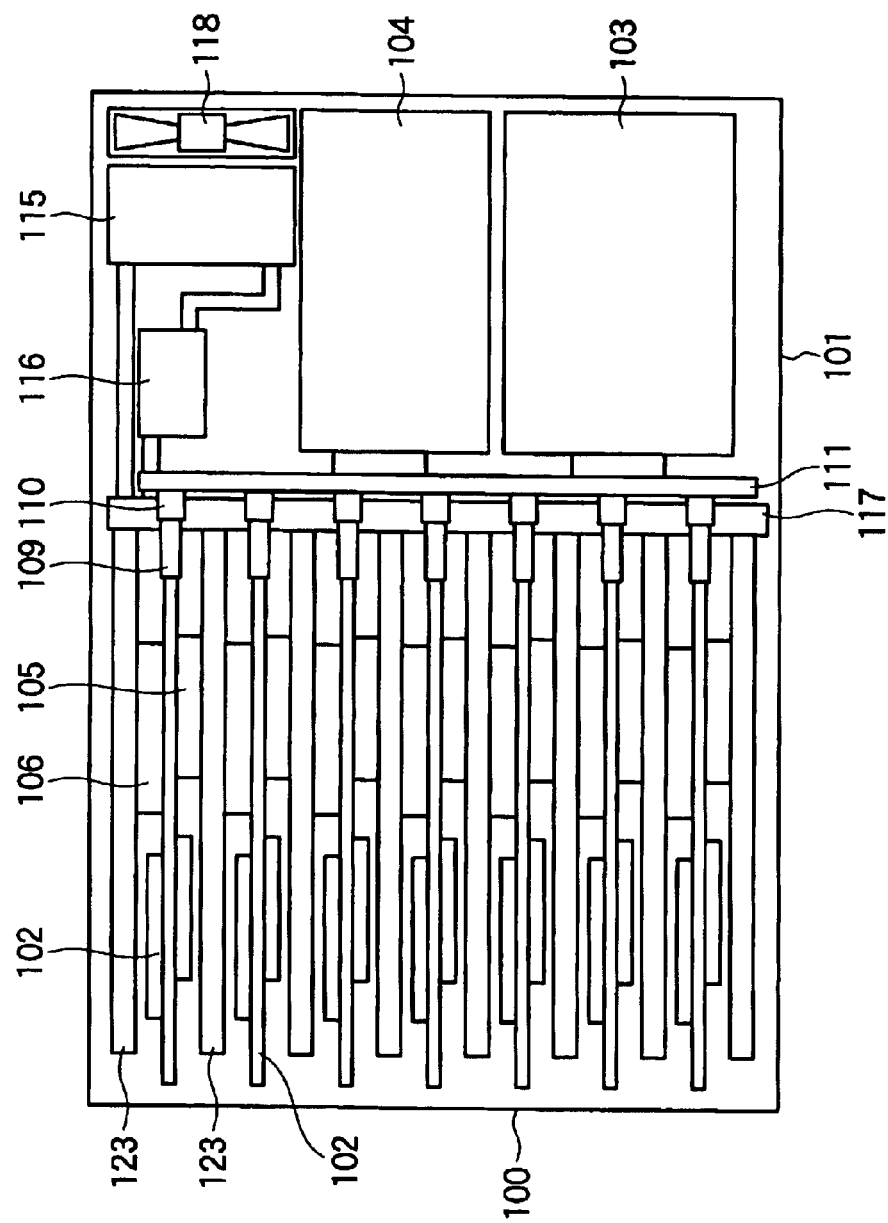
FIG. 22 is a top view illustrating a modification of the electronic equipment shown in FIG. 18.

FIG. 22 is a top view illustrating electronic equipment 101 of a modification of the preferred embodiment shown in FIG. 18. As shown, the electronic equipment 101 is basically identical to the one shown in FIG. 18. The difference is that the heat generating elements 105 and 106 are mounted on both sides of the wiring board 102 mounted in the housing 100, rather than on one side thereof only. The wiring board 102 having the heat generating elements 105 and 106 on both sides thereof is thermally coupled to the cooling plate 123 rather than via the thermal conductor 30. This arrangement allows a single cooling plate 123 to cool two wiring boards 102, each having the heat generating elements 105 and 106 on both sides thereof, and is appropriate for a layout within the housing of the electronic equipment 101, which has typically a small space available. The thermal conductor 30 may be interposed between the wiring board 102 and the cooling plate 123.

When the wiring board 102 having the heat generating elements 105 and 106 is loaded to or unloaded from the electronic apparatus, thermal coupling and decoupling are performed with the cooling plate 123 connected to the fluid cooling system (the fluid cooling circulation loop) arranged in the electronic apparatus. The loading and unloading of the wiring board 102 are possible even in the middle of the operation of the electronic apparatus without the need for stopping the operation of the system. Since the cooling plate 123 is pre-connected with the cooling system arranged in the electronic apparatus, the loading and unloading of the wiring board 102 are easily and safely performed without leakage of the enclosed cooling fluid.

When the wiring board 102 is loaded into and unloaded from the electronic apparatus, a simple operation permits the wiring board 102 to be thermally coupled to and decoupled from the cooling system in the electronic apparatus while making and breaking electrical conduction with the electronic apparatus. Without stopping the operation of the system, the wiring board 102 is replaced in the middle of the electronic apparatus. This arrangement facilitates the addition and maintenance of the wiring board 102. A highly reliable and highly efficient cooling system of the electronic apparatus is thus achieved.

What is claimed is:

1. Electronic equipment comprising:
   a plurality of electronic apparatuses, each electronic apparatus having a semiconductor element;
   a rack for storing the plurality of electronic apparatuses stacked with one above another;
   in each of the electronic apparatuses, a first cooling device including a first heat receiver for receiving heat from the semiconductor element, a first fluid circulator for circulating a fluid through the first heat receiver, a first heat exchanger for discharging heat of the fluid, and a first piping for connecting the first heat receiver, the first fluid circulator, and the first heat exchanger; and
   in the rack, a second cooling device including a second heat receiver in contact with the first heat receiver, a second fluid circulator for circulating the fluid through the second heat receiver, a second heat exchanger in contact with the second heat receiver, and a second piping for connecting the second heat receiver, the second fluid circulator, and the second heat exchanger.

2. Electronic equipment according to claim 1, wherein the first cooling device is detachably mounted on the rack, and wherein the second piping comprises a switching valve for switching the supplying of the fluid to the second cooling device when the first cooling device is mounted to or demounted from the second piping.

3. Electronic equipment according to claim 1, wherein the direction of circulation of the fluid circulating in the first cooling device is different from the direction of circulation of the fluid circulating in the second cooling device.

4. Electronic equipment according to claim 1, wherein the diameter of the second piping becomes smaller from upstream to downstream in the circulation of the fluid.

5. Electronic equipment comprising, in a casing, an electronic module having a heat generator, a fluid circulator for circulating a cooling fluid, a heat exchanger for exchanging heat with the cooling fluid, a fan for blowing a cooling air to the heat exchanger, a cooling jacket which is integrally attached to the electronic module and has a passage of the cooling fluid therewithin, and a unit for detachably mounting the electronic module and the cooling jacket in as unitary body in the casing.

6. Electronic equipment according to claim 5, wherein the electronic module and the cooling jacket integrally attached to the electronic module comprise an electrical connection unit and a hydraulic coupling unit, respectively, and wherein the electrical connection unit and the hydraulic coupling unit extend in the same direction.

7. Electronic equipment according to claim 6, wherein the electrical connection unit of the electronic module and the hydraulic coupling unit of the cooling jacket are placed adjacent to each other.

8. Electronic equipment according to claim 5, further comprising, in the casing, a mother wiring board for electrically connecting a plurality of electronic modules to the electronic equipment, and a header for hydraulically coupling a plurality of cooling jackets.

9. Electronic equipment according to claim 8, further comprising a fluid connector, which opens or closes the flow of the fluid by the insertion thereof or the removal thereof, serves as a hydraulic coupler between the cooling jacket and the header.

10. Electronic equipment comprising, in a casing, an electronic module having a heat generator, a fluid circulator for circulating a cooling fluid, a heat exchanger for exchanging heat with the cooling fluid, a fan for blowing a cooling air to the heat exchanger, and a cooling jacket, arranged beforehand within the casing, having a passage of the cooling fluid therewithin, wherein the electronic module is designed to be integrally attached to the cooling jacket when the electronic module is mounted in the electronic equipment.

11. Electronic equipment according to claim 10, further comprising, in the casing, a mother wiring board for electrically connecting a plurality of electronic modules to the electronic equipment, and a header which is hydraulically coupled beforehand to a plurality of jackets.

12. A casing of electronic equipment comprising a detachably mounted electronic module having a heat generator and a cooling jacket integrally attached thereto, a fluid circulator for circulating a cooling fluid, a heat exchanger for exchanging heat with the cooling fluid, a fan for blowing a cooling air to the heat exchanger, a mother wiring board for electrically connecting the electronic module, and a header for hydraulically coupling the cooling jacket integrally attached to the electronic module.

13. A casing according to claim 12, wherein the header is hydraulically coupled to the fluid circulator of the cooling fluid.

14. A casing according to claim 12, wherein the header is disposed adjacent to an electronic connection unit of the electronic module.

15. A casing according to claim 12, further comprising a fluid connector, which opens or closes the flow of the fluid by the insertion thereof or the removal thereof, serves as a hydraulic coupler between the cooling jacket and the header.

16. A casing of electronic equipment comprising a detachably mounted electronic module having a heat generator, a fluid circulator for circulating a cooling fluid, a heat exchanger for exchanging heat with the cooling fluid, a fan for blowing a cooling air to the heat exchanger, a mother wiring board for electrically connecting the electronic module, and a cooling jacket which has a passage of the cooling fluid therewithin, and which is thermally coupled to the electronic module when the electronic module is mounted in the casing.

17. A casing according to claim 16, further comprising a header, wherein a plurality of cooling jackets are hydraulically coupled to the header.

18. Electronic equipment comprising, in a casing, an electronic module having a heat generator, a fluid circulator for circulating a cooling fluid, a heat exchanger for exchanging heat with the cooling fluid, a fan for blowing a cooling air to the heat exchanger, a cooling jacket which includes a passage of the cooling fluid therewithin and is integrally attached to the electronic module, and a unit for detachably mounting the electronic module having the cooling jacket integrally attached thereto in the casing.

19. Electronic equipment according to claim 18, wherein the electronic module and the cooling jacket integrally attached thereto have an electrical connection unit and a hydraulic coupling unit, respectively, and wherein the electrical connection unit and the hydraulic coupling unit extend in the same direction.

20. Electronic equipment according to claim 19, wherein the electrical connection unit of the electronic module and the hydraulic coupling unit of the cooling jacket are arranged adjacent to each other.

21. Electronic equipment according to claim 18, further comprising, in the casing, a mother wiring board for electrically connecting a plurality of electronic modules to the electronic equipment, and a header for hydraulically coupling a plurality of cooling jackets.

22. Electronic equipment according to claim 21, further comprising a fluid connector, which opens or closes the flow of the fluid by the insertion thereof or the removal thereof, serves as a hydraulic coupler between the cooling jacket and the header.

23. Electronic equipment comprising, in a casing, an electronic module having a heat generator, a fluid circulator for circulating a cooling fluid, a heat exchanger for exchanging heat with the cooling fluid, a fan for blowing a cooling air to the heat exchanger, a cooling jacket which is mounted beforehand in the casing, and includes a passage of the cooling fluid therewithin, wherein the electronic module is integrally attached to the cooling jacket when the electronic module is mounted in the electronic equipment.

24. Electronic equipment according to claim 23, further comprising, in the casing, a mother wiring board for electrically connecting a plurality of electronic modules to the electronic equipment, and a header which is hydraulically coupled beforehand to a plurality of cooling jackets.

25. A casing of electronic equipment comprising a detachably electronic module having a heat generator and a cooling jacket integrally attached thereto, a fluid circulator for circulating a cooling fluid, a heat exchanger for exchanging heat with the cooling fluid, a fan for blowing a cooling air to the heat exchanger, a mother wiring board for electrically connecting the electronic module, and a header for hydraulically coupling the cooling jacket integrally attached to the electronic module.

26. A casing according to claim 25, wherein the header is hydraulically coupled to the fluid circulator of the cooling fluid.

27. A casing according to claim 25, wherein the header is disposed adjacent to an electronic connection unit of the electronic module.

28. A cashing according to claim 25, further comprising a fluid connector, which opens or closes the flow of the fluid by the insertion thereof or the removal thereof, serves as a hydraulic coupler between the cooling jacket and the header.

29. A casing of electronic equipment comprising a detachably mounted electronic module having a heat generator, a fluid circulator for circulating a cooling fluid, a heat exchanger for exchanging heat with the cooling fluid, a fan for blowing a cooling air to the heat exchanger, a mother wiring board for electrically connecting the electronic module, and a cooling jacket which has a passage of the cooling fluid therewithin, and which is thermally coupled to the electronic module when the electronic module is mounted in the casing.

30. A casing according to claim 29, further comprising a header, wherein a plurality of cooling jackets are connected to the header.

* * * * *